United States Patent
Chi et al.

(10) Patent No.: US 10,640,525 B2
(45) Date of Patent: May 5, 2020

(54) PLATINUM COMPLEX, OLED AND APPARATUS FOR PROVIDING VISIBLE EMISSION OR NEAR-INFRARED EMISSION

(71) Applicant: National Tsing Hua University, Hsinchu (TW)

(72) Inventors: Yun Chi, Hsinchu (TW); Rajakannu Palanisamy, Hsinchu (TW); Meganathan Nandakumar, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 469 days.

(21) Appl. No.: 15/411,447

(22) Filed: Jan. 20, 2017

(65) Prior Publication Data

US 2018/0155380 A1    Jun. 7, 2018

(30) Foreign Application Priority Data

Dec. 7, 2016  (TW) .............................. 105140325 A

(51) Int. Cl.
  *C07F 15/00* (2006.01)
  *C09K 11/06* (2006.01)
  (Continued)

(52) U.S. Cl.
  CPC .......... *C07F 15/0086* (2013.01); *C09K 11/06* (2013.01); *H01L 51/0087* (2013.01);
  (Continued)

(58) Field of Classification Search
  CPC .................................................. C07F 15/0086
  See application file for complete search history.

(56) References Cited

U.S. PATENT DOCUMENTS

2015/0243913 A1    8/2015  Takizawa et al.

FOREIGN PATENT DOCUMENTS

| CN | 101115762 | 1/2008 |
| JP | 2006182921 A * | 7/2006 |
| TW | 201319072 | 5/2013 |

OTHER PUBLICATIONS

English machine translation of Noboru et al. JP 2006182921-A (Year: 2006).*

* cited by examiner

*Primary Examiner* — Peter F Godenschwager
(74) *Attorney, Agent, or Firm* — J.C. Patents

(57) ABSTRACT

A platinum complex, an OLED and an apparatus for providing visible emission or near-infrared (NIR) emission using the same are described. The platinum complex has a structure represented by formula (I):

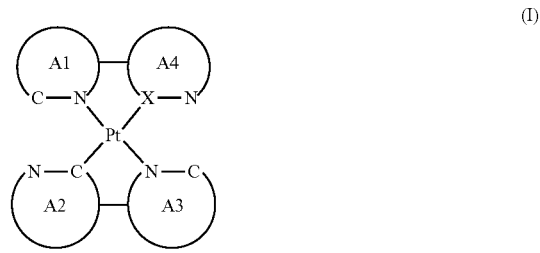

(I)

wherein A1 to A4 each independently represent a 5-membered or 6-membered unsaturated ring, a first chelating ligand including A1 and A4 fragments has a minus one formal charge, and a second chelating ligand including A2 and A3 fragments has a minus one formal charge.

10 Claims, 5 Drawing Sheets

(51) Int. Cl.
*H01L 51/00* (2006.01)
*H01L 51/50* (2006.01)
(52) U.S. Cl.
CPC .... *C09K 2211/185* (2013.01); *H01L 51/5012* (2013.01); *H01L 51/5056* (2013.01); *H01L 51/5072* (2013.01); *H01L 51/5088* (2013.01); *H01L 51/5096* (2013.01)

PLATINUM COMPLEX, OLED AND APPARATUS FOR PROVIDING VISIBLE EMISSION OR NEAR-INFRARED EMISSION

CROSS-REFERENCE TO RELATED APPLICATION

This application claims the priority benefit of Taiwan application serial no. 105140325, filed on Dec. 7, 2016. The entirety of the above-mentioned patent application is hereby incorporated by reference herein and made a part of this specification.

BACKGROUND OF THE INVENTION

Field of the Invention

The invention relates to a metal complex, and more particularly, to a platinum complex and its application.

Description of Related Art

Organic-light emitting diode (OLED) devices have advantages of high brightness, fast screen response speed, compact size, full color, no visual angle difference, no LCD backlighting, low power consumption, etc., so they are widely applied in the production of large-area, high brightness and full color flat-panel displays.

To develop various new light-emitting devices having an emission range covering the visible region and the near-infrared region, the development of various colored light-emitting materials having high stability and high emission efficiency is the main object of current OLED research. The existing tetra-coordinated platinum complex has suitable emission characteristics, but the synthesis thereof requires time-consuming purification steps. Therefore, the existing tetra-coordinated platinum complex is not suitable for a commercial production.

SUMMARY OF THE INVENTION

The invention provides a platinum complex that has structural stability and excellent luminous efficiency, and is easy to synthesize.

The invention further provides an OLED and an apparatus capable of emitting visible light or near-infrared light, each of which includes the platinum complex of the invention.

The present invention provides a platinum complex having a structure represented by general formula (I):

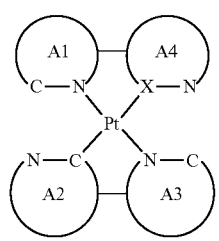

(I)

wherein A1 to A4 each independently represent a 5-membered or 6-membered unsaturated ring; X is carbon or nitrogen; and a first chelating ligand including A1 and A4 has a minus one formal charge, and a second chelating ligand including A2 and A3 has a minus one formal charge.

In an embodiment of the invention, the platinum complex has a structure represented by formula (I-1):

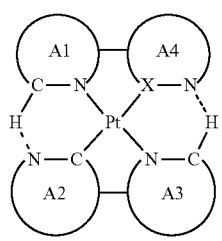

(I-1)

wherein a hydrogen bond exists between the first chelating ligand and the second chelating ligand.

In an embodiment of the invention, the platinum complex has a structure represented by formula (IA):

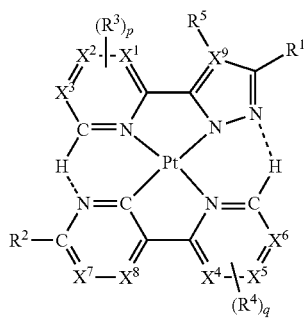

(IA)

wherein $X^1$ to $X^9$ each independently represent carbon or nitrogen; $R^1$ and $R^2$ each independently represent substituted or unsubstituted $C_1$-$C_6$ alkyl, —$CF_2H$, —$CFH_2$, substituted or unsubstituted $C_6$-$C_{12}$ aryl or $C_mF_{2m+1}$, m is an integer of 0 to 5; $R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or —$C_mF_{2n+1}$, and n is an integer of 0 to 3; p and q each independently represent an integer of 0 to 3; when $X^9$ is carbon, $R^5$ can be hydrogen, fluoride, chloride or cyano; when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

In an embodiment of the invention, the platinum complex has a structure represented by formula (IB):

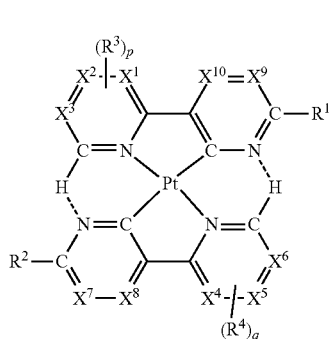

(IB)

wherein $X^1$ to $X^{10}$ each independently represent carbon or nitrogen; $R^1$ and $R^2$ each independently represent substituted or unsubstituted $C_1$-$C_6$ alkyl, —$CF_2H$, —$CFH_2$, substituted or unsubstituted $C_6$-$C_{12}$ aryl or —$C_mF_{2m+1}$, and m is an integer of 0 to 5; $R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or —$C_nF_{2n+1}$, n is an integer of 0 to 3; p and q each independently represent an integer of 0 to 3; when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

In view of the above, when a C—H . . . N hydrogen bond exists between two chelating ligands of the platinum complex of the invention, the bonding strength between chelating ligands and the central platinum metal can be increased, so as to further stabilize the structure of the platinum complex of the invention. Besides, such hydrogen bond is beneficial to reduce steric hindrance between the chelating ligands, so as to provide a standard planar molecular structure. When the complex of the invention is condensed to form a solid structure, such hydrogen bond enables the formation of a defect-free linear stack. Specifically, the intermolecular Pt . . . Pt spacing is shortened to form a MMLCT excited state electron configuration, so the emission of the complex significantly red shifts to the near infrared region. Moreover, the platinum complex of the invention has at least one C—Pt coordination bond. The C—Pt bond has a greater bond energy than that of the N—Pt bond, so the overall bonding strength between the chelating ligands and the central metal atom can be increased. In addition, the platinum complex of the invention is easy to synthesize, so it is suitable for mass production and accordingly provides a higher commercial value.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
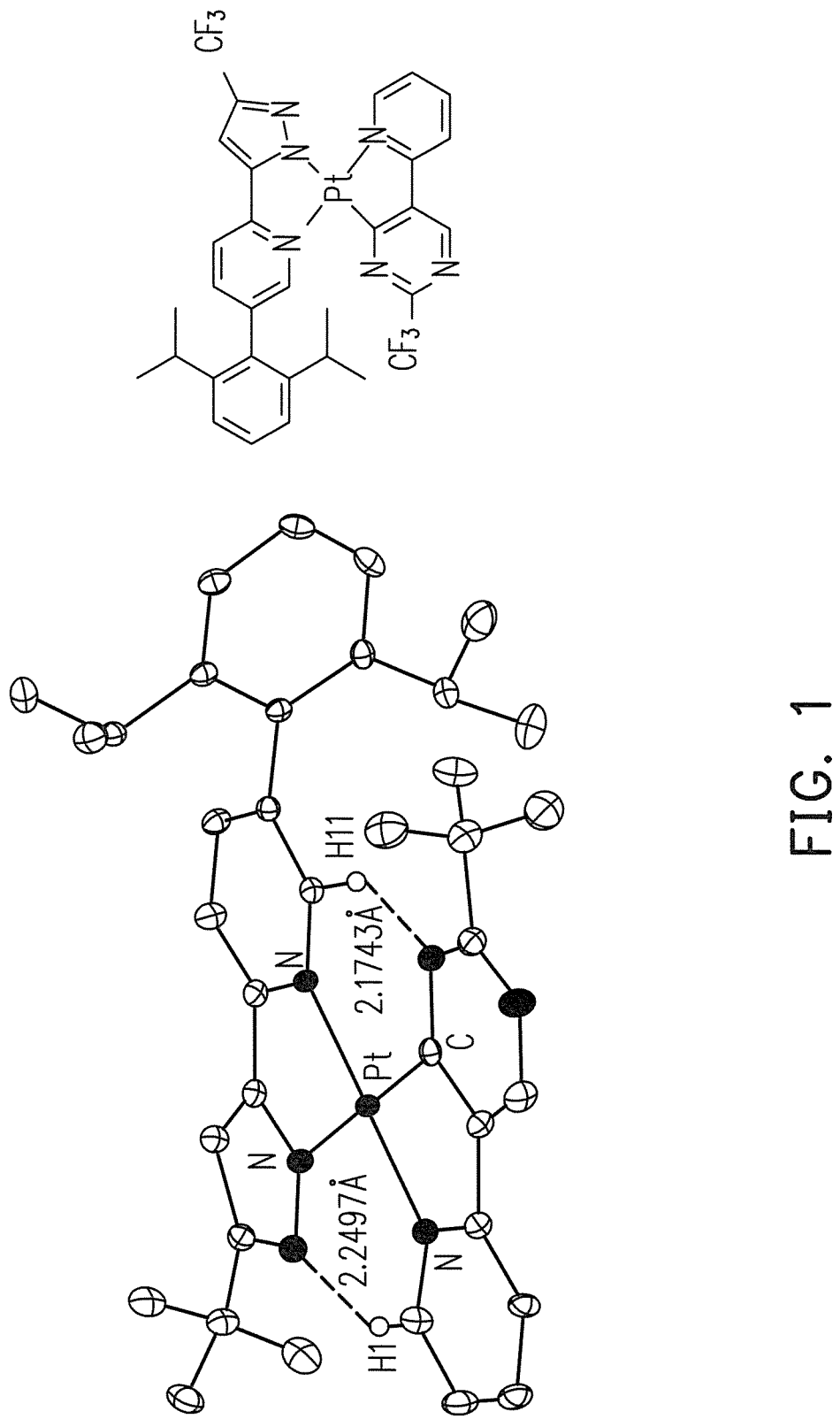
FIG. 1 shows the X-ray crystal diffraction analysis of compound (IA-5) synthesized in example 5 of the invention.

In the following, embodiments are provided to further describe the invention, but the embodiments are only exemplary and are not intended to limit the scope of the invention.

The platinum complex of the invention has a structure represented by formula (I):

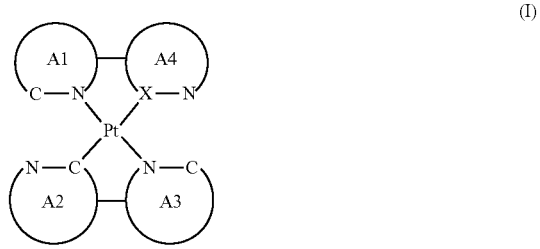

(I)

wherein A1 to A4 each independently represent a 5-membered or 6-membered unsaturated ring; X is carbon or nitrogen; and a first chelating ligand including A1 and A4 has a minus one formal charge (or valence), and a second chelating ligand including A2 and A3 has a minus one formal charge (or valence).

In an embodiment, A1 to A4 each independently represent a 5-membered or 6-membered unsaturated ring containing 0, 1 or 2 atoms selected from nitrogen, oxygen and sulphur. In another embodiment, A1 to A4 each independently represent a 5-membered or 6-membered unsaturated ring containing 0, 1, 2, 3 or 4 nitrogen atoms and 0 oxygen or sulphur atom.

Since the total negative charge of two chelating ligands of the platinum complex of the invention is the same as the positive charge of the central platinum metal ion, a neutral platinum complex can be formed. A neutral complex generally has better volatility, and therefore a multilayer OLED light-emitting device can be formed using an evaporation method, and the luminous efficiency thereof can be improved.

In an embodiment, the platinum complex of the invention has a structure represented by formula (I-1):

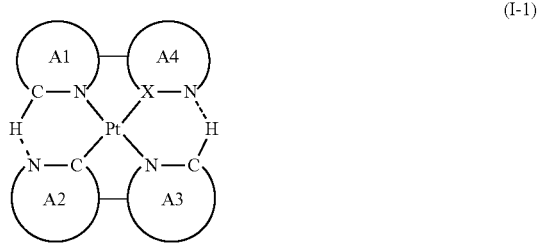

(I-1)

wherein an inter-ligand and intermolecular hydrogen bond exists between the first chelating ligand and the second chelating ligand, so as to further stabilize the molecular structure.

As shown in formula (I-1), at least one hydrogen bond (e.g., two hydrogen bonds) exists between two chelating ligands of the platinum complex of the invention, such that the bonding strength between the chelating ligands and the central platinum metal can be increased, and thus, the platinum complex of the invention can be provided with a square planar structure with improved stability. By such manner, the platinum complex of the invention provides a better intermolecular stack and therefore a longer emission wavelength.

In an embodiment, the platinum complex represented by formula (I-1) can include the platinum complex represented by formula (IA) or formula (IB).

In an embodiment, when A1 is a 6-membered ring, A2 is a 6-membered ring, A3 is a 6-membered ring and A4 is a 5-membered ring, the platinum complex of the invention has a structure represented by formula (IA):

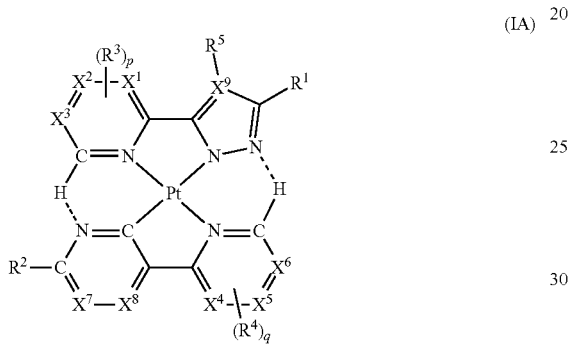

(IA)

wherein $X^1$ to $X^9$ each independently represent carbon or nitrogen; $R^1$ and $R^2$ each independently represent substituted or unsubstituted $C_1$-$C_6$ alkyl, —$CF_2H$, substituted or unsubstituted $C_6$-$C_{12}$ aryl or $C_mF_{2m+1}$, m is an integer of 0 to 5; $R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{17}$ aryl or —$C_nF_{2n+1}$, and n is an integer of 0 to 3; p and q each independently represent an integer of 0 to 3; when $X^9$ is carbon, $R^5$ can be hydrogen, fluoride, chloride or cyano; when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

In an embodiment, $R^1$ includes —$C_nF_{2n+1}$, and n is an integer of 0 to 3.

In an embodiment, the platinum complex of the invention has a structure represented by one of formula (IA-1) to formula (IA-22):

IA-1

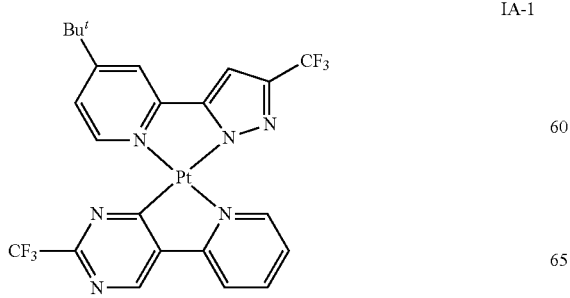

IA-2

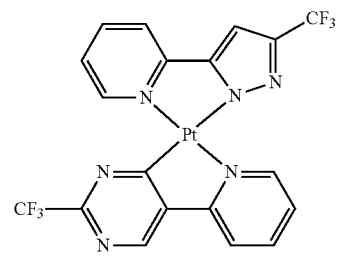

IA-3

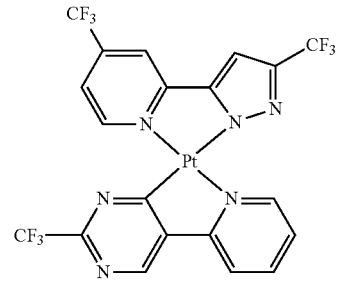

IA-4

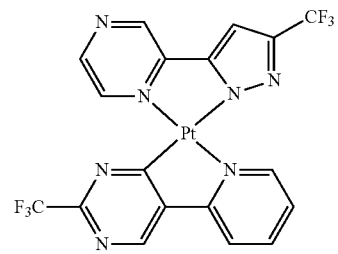

IA-5

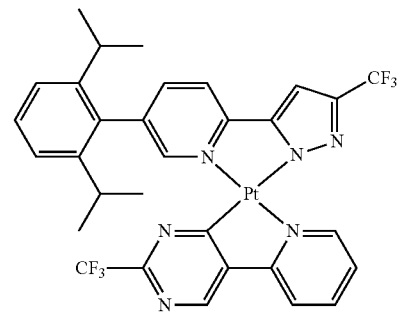

IA-6

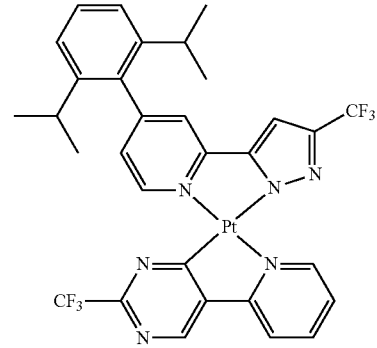

-continued
IA-7
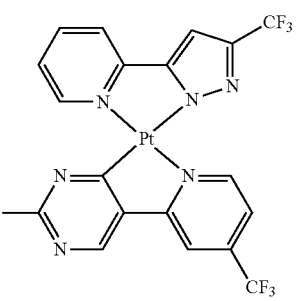
IA-8
IA-9
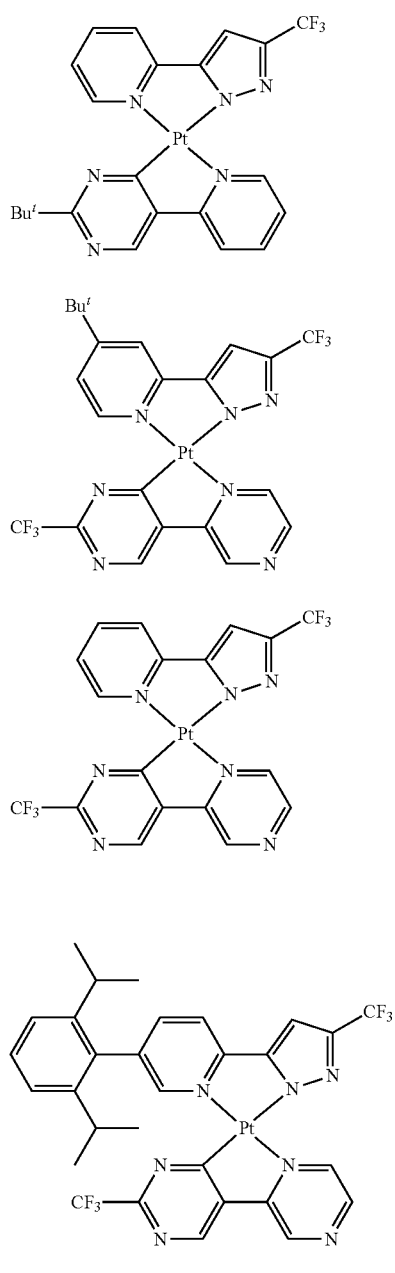
IA-10
IA-11
IA-12
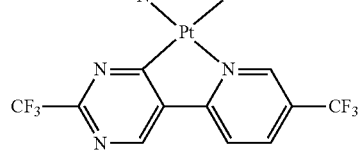
IA-13
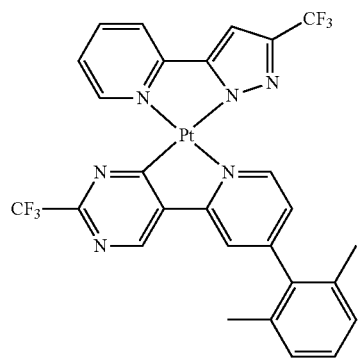
IA-14
IA-15
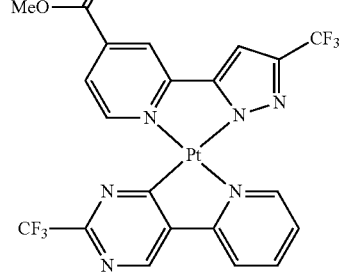

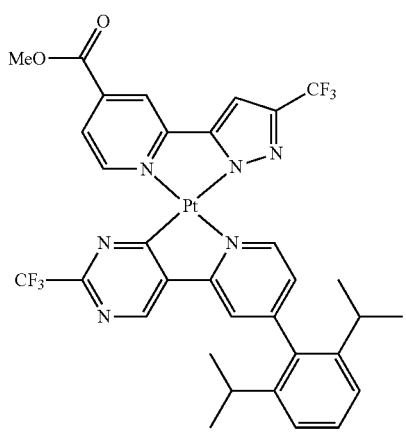
IA-16
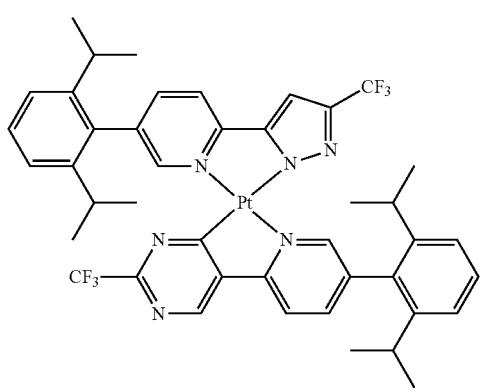
IA-17
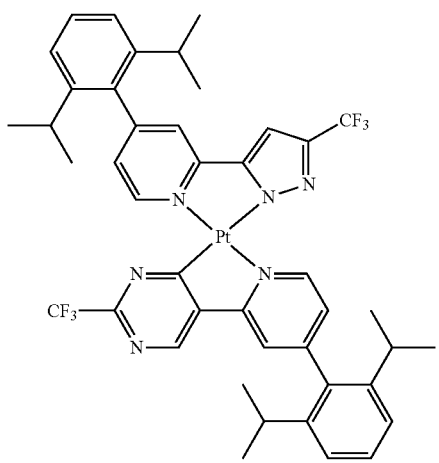
IA-18
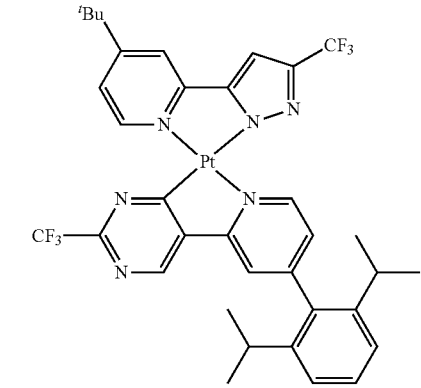
IA-19
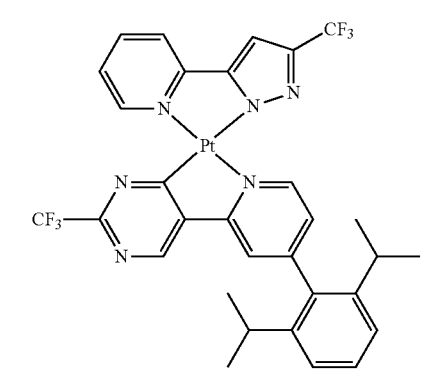
IA-20
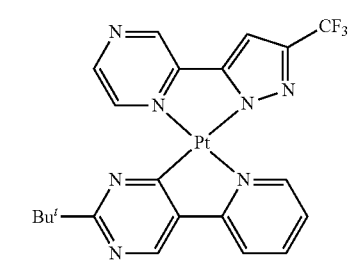
IA-21
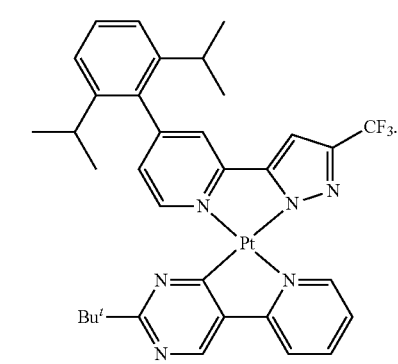
IA-22
In an embodiment, when A1 is a 6-membered ring, A2 is a 6-membered ring, A3 is a 6-membered ring and A4 is a 6-membered ring, the platinum complex of the invention has a trans-structure represented by formula (IB):

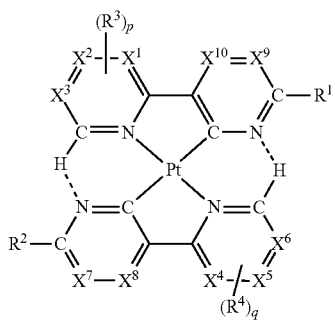

(IB)

wherein $X^1$ to $X^{10}$ each independently represent carbon or nitrogen; $R^1$ and $R^2$ each independently represent substituted or unsubstituted $C_1$-$C_6$ alkyl, —$CF_2H$, —$CFH_2$, substituted or unsubstituted $C_6$-$C_{12}$ aryl or —$C_mF_{2m+1}$, and m is an integer of 0 to 5; $R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or —$C_nF_{2n+1}$, n is an integer of 0 to 3; p and q each independently represent an integer of 0 to 3; when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

In an embodiment, the platinum complex of the invention has a structure represented by one of formula (IB-1) to formula (IB-4):

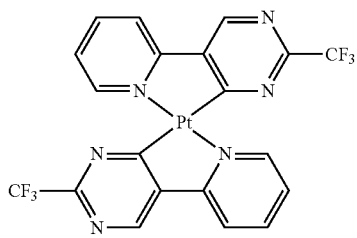

(IB-1)

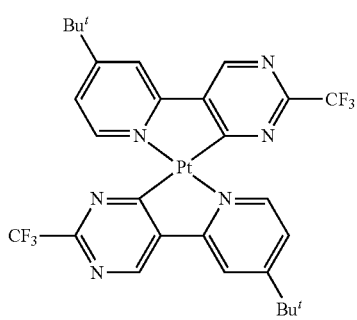

(IB-2)

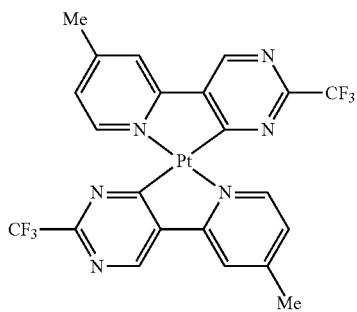

(IB-3)

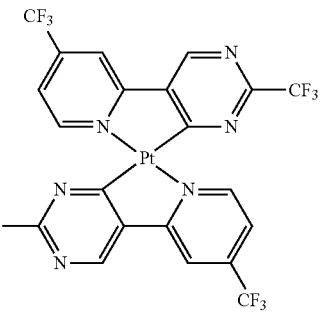

(IB-4)

The above embodiments in which hydrogen bonds exist between two chelating ligands of the platinum complex of the invention are provided for illustration purposes, and are not construed as limiting the present invention. In another embodiment, a strong Pt—C bond can be introduced to the platinum complex to stabilize the molecular structure.

Specifically, the platinum complex of the invention has a structure represented by formula (II):

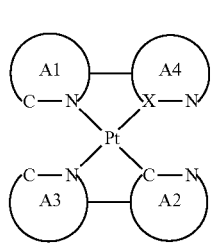

(II)

wherein A1 to A4 each independently represent a 5-membered or 6-membered unsaturated ring; X is carbon or nitrogen; and a first chelating ligand including A1 and A4 has a minus one formal charge, and a second chelating ligand including A2 and A3 has a minus one formal charge.

The structure of formula (I) is similar to the structure of formula (II), and the difference between them lies in that: in formula (I), the Pt—N bond of first chelating ligand corresponds to the Pt—C bond of the second chelating ligand and the Pt—C bond of the first chelating ligand corresponds to the Pt—N bond of the second chelating ligand; while in formula (II), the Pt—N bond of the first chelating ligand corresponds to the Pt—N bond of the second chelating ligand and the Pt—C bond of the first chelating ligand corresponds to the Pt—C bond of the second chelating ligand.

In an embodiment, when A1 is a 6-membered ring, A2 is a 6-membered ring, A3 is a 6-membered ring and A4 is a 6-membered ring, the platinum complex of the invention has a cis-structure represented by formula (IIB):

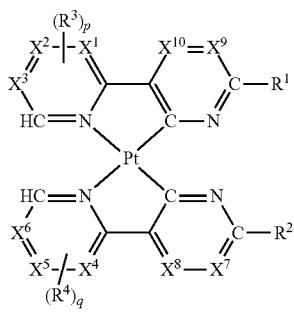

(IIB)

wherein $X^1$ to $X^{10}$ each independently represent carbon or nitrogen; W and $R^2$ each independently represent substituted or unsubstituted $C_1$-$C_6$ alkyl, —$CF_2H$, —$CFH_2$, substituted or unsubstituted $C_6$-$C_{12}$ aryl or m is an integer of 0 to 5; $R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or n is an integer of 0 to 3; p and q each independently represent an integer of 0 to 3; when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

In an embodiment, the platinum complex of the invention has a structure represented by one of formula (IIB-1) to formula (IIB-4):

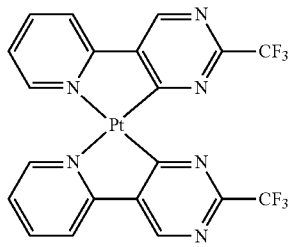

IIB-1

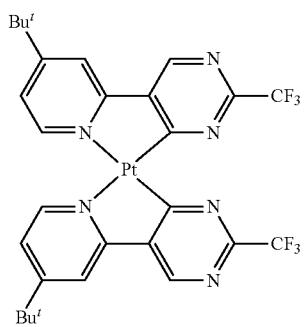

IIB-2

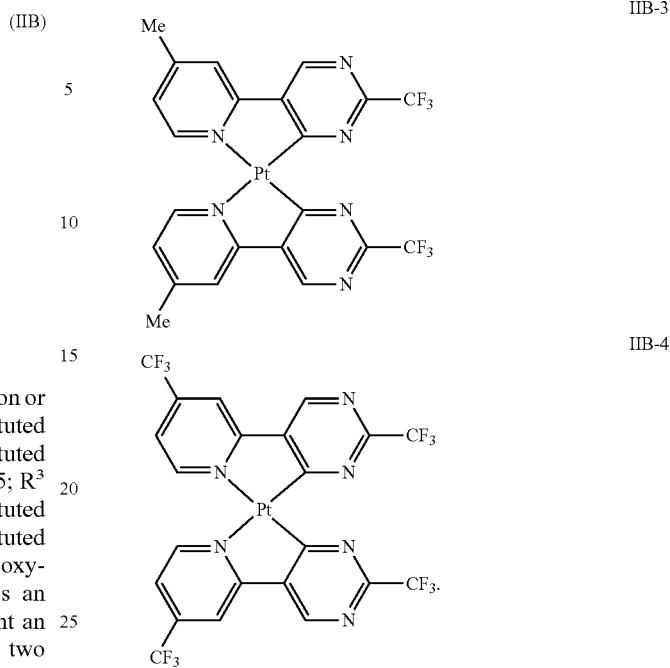

IIB-3

IIB-4

Generally speaking, each of the complexes represented by formula (IB-1) to (IB-4) has a trans-structure, so inter-ligand C—H . . . N hydrogen bonds are generated between the ligands thereof. Therefore, such complex has better rigidity and planarity, is easy to stack to form an improved 1D linear stack structure, and has a near-infrared emission upon the excitation. On the other hand, although there is no C—H . . . N hydrogen bond generated between the ligands of each of the complexes represented by formula (IIB-1) to (IIB-4), two strong Pt—C bonds in combination with two Pt—N bonds also help to stabilize the complex. Specifically, two strong Pt—C bonds are preferably introduced to the same side (rather than different sides) of the complex, so as to form a stable cis-structure with Pt—C bonds corresponding to each other.

The aromatic ring can include an aromatic hydrocarbon ring or an aromatic heterocyclic ring. Specific examples of the aromatic ring include a phenyl ring, a pyridine ring, a pyrazine ring, a pyrimidine ring, a pyridazine ring, a triazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadiazole ring, and a pyrazole ring.

In an embodiment, the platinum complex of the invention has an emission wavelength of about 450 nm and 1,200 nm, so the application thereof is relatively broad. Specifically, when the emission wavelength of the platinum complex of the invention is in the visible light range, such platinum complex can be applied in the OLED field. When the emission wavelength of the platinum complex of the invention is greater than 700 nm and falls within the near-infrared range, such platinum complex can be applied in the military or medical field to provide a light source invisible to the naked eye or a light source capable of penetrating the human body or animal tissue. As compared to the existing platinum complexes, the platinum complex of the invention has a longer emission wavelength (e.g., greater than 800 nm), so it can penetrate more deeply into the human body or animal tissue at the target site.

In an embodiment, the invention provides an apparatus emitting visible light or near-infrared light and including one of the above-mentioned platinum complexes.

In an embodiment, the invention provides an OLED including two electrodes and a light-emitting layer disposed between the two electrodes, and the light-emitting layer contains the platinum complex of the invention. The platinum complex can be used as a dopant for a host material of the light-emitting layer. The material of each of the two electrodes can be selected from materials commonly used in the field, and other functional layers (such as an electron-transport layer, a hole-injection layer, a hole-transport layer, a hole-blocking layer or the like) can also be disposed between each of the electrodes and the light-emitting layer via a known technique in the art. The OLED can be manufactured on a flat substrate, such as conductive glass or a plastic substrate.

[Preparation Method of Platinum Complex]

Synthesis of Chelating Ligands

The ligands for each platinum complex of the invention has a 5-membered ring or a 6-membered ring, and the 5-membered ring or 6-membered ring has at least one nitrogen atom or another electron-donating atom such as fluoride or oxygen atom(s). In an embodiment, ligand precursors for the platinum complex of the invention can be selected from the group consisting of ligand precursor L1 to ligand precursor L15.

L1
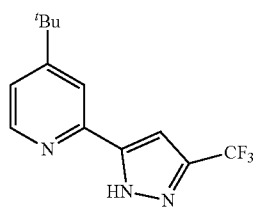

L2
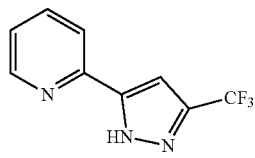

L3
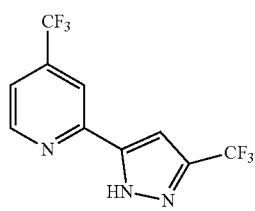

L4
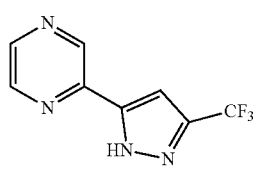

L5
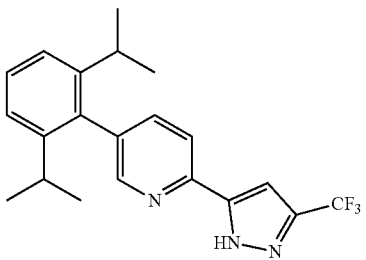

L6
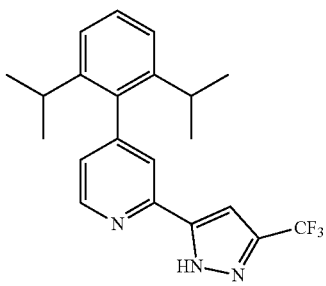

L7
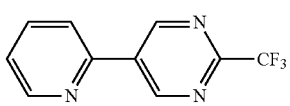

L8
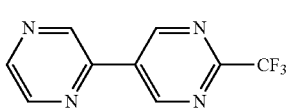

L9
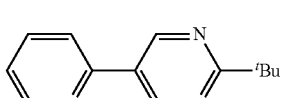

L10

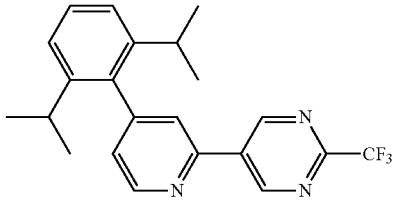

L11
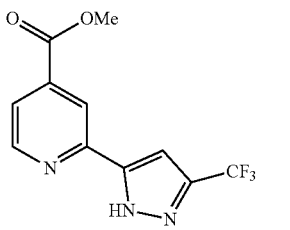

L12
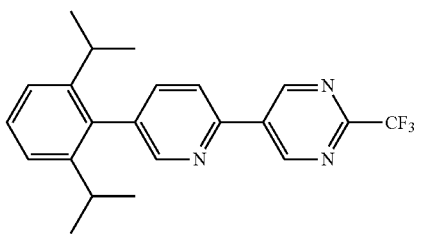

-continued

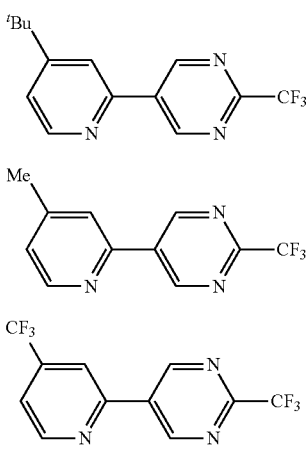

L13

L14

L15

In an embodiment, ligand precursor L7 can be synthesized using the experimental procedures listed below:

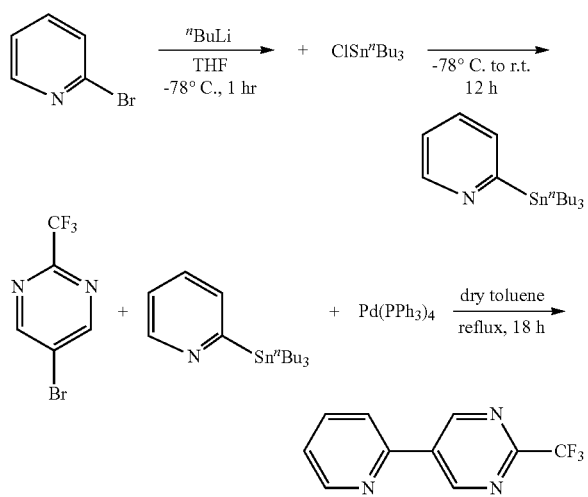

To a solution of 2-bromopyridine (5.00 g, 31.7 mmol) in tetrahydrofuran (100 mL) was added 14 mL of a 2.5 M solution of "BuLi in hexane (35 mmol) at −78° C. under N₂. After stirring for 1 hour, "Bu₃SnCl (10.3 mL, 38.0 mmol) was added and stirred at −78° C. for 1 hour. The mixture was warmed to room temperature and stirred overnight. The mixture was then quenched with saturated NH$_4$Cl$_{(aq)}$ (100 mL) and extracted with ethyl acetate (3×75 mL). The combined organic layers were dried over Na₂SO₄ and the solvent was removed under vacuum to obtain crude 2-(tributylstannyl)pyridine. This crude product was used in the next step without any further purification.

Next, the obtained 2-(tributylstannyl)pyridine, 2-trifluoromethyl-5-bromo-pyrimidine (3.59 g, 15.8 mmol), Pd(PPh₃)₄ (913 mg, 0.79 mmol) and toluene (100 mL) were placed in a Schlenk flask. The reaction mixture was refluxed for 24 hours and cooled to room temperature. The mixture was quenched with water, and the organic layer was separated and dried over anhydrous Na₂SO₄. The solvent was removed under vacuum, and the residue was then purified by column chromatography (silica gel, ethyl acetate/hexane=1:4) to obtain a colorless solid (2.49 g, yield: 70%).

Spectral data of ligand precursor L7: $^1$H NMR (400 MHz, CDCl₃, 298 K): 9.47 (s, 2H), 8.78 (d, J=8.0 Hz, 1H), 7.87 (dt, J=8.0, 1.6 Hz, 1H), 7.82~7.80 (m, 1H), 7.42~7.39 (m, 1H). $^{19}$F NMR (376 MHz, CDCl₃, 298 K): δ−70.22 (s, 3F). EI MS: m/z 225.1 (M⁺).

In an embodiment, ligand precursor L8 can be synthesized using the procedures listed below:

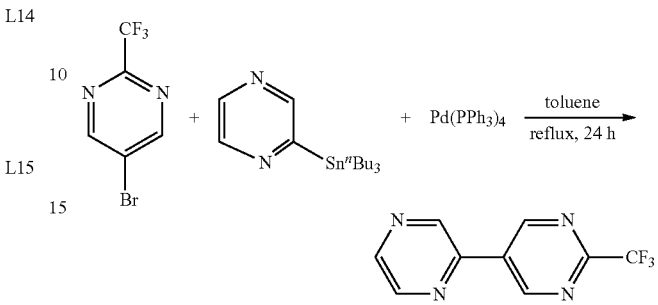

A mixture of 5-bromo-2-(trifluoromethyl)pyrimidine (3.59 g, 15.8 mmol), 2-(tributylstannyl)pyrazine (12.9 g, 34.8 mmol) and Pd(PPh₃)₄ (913 mg, 0.79 mmol) in toluene (100 mL) was refluxed for 24 hours and cooled to room temperature. The toluene solution was washed with water, dried over anhydrous Na₂SO₄ and evaporated to dryness under vacuum. The collected crude product was purified by column chromatography (SiO₂, ethyl acetate/n-hexane=1:3) to obtain a white solid (2.14 g, yield: 60%).

Spectral data of ligand precursor L8: $^1$H NMR (400 MHz, CDCl₃, 298 K): δ 9.51 (s, 2H), 9.13 (d, J=1.6 Hz, 1H), 8.75 (dd, J=2.4, 1.6 Hz, 1H), 8.71 (d, J=2.0 Hz, 1H). $^{19}$F NMR (376 MHz, CDCl₃, 298 K): δ−70.32 (s, 3F). EI MS: m/z 226.1 (M⁺).

In an embodiment, ligand precursor L9 can be synthesized using the procedures listed below:

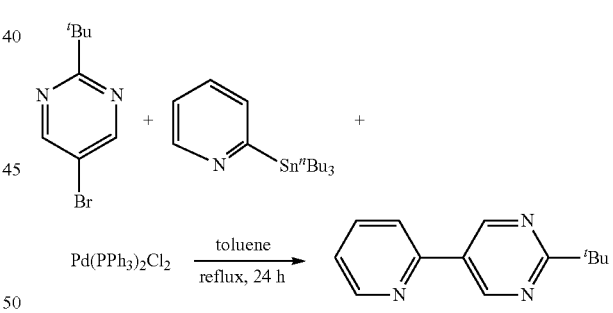

A mixture of 5-bromo-2-(tert-butyl)pyrimidine (1.00 g, 4.65 mmol), 2-(tributylstannyl)pyrazine (3.94 g, 10.7 mmol) and Pd(PPh₃)₂Cl₂ (161 mg, 0.23 mmol) in toluene (80 mL) was refluxed for 24 hours and cooled to room temperature. The toluene solution was quenched with water, dried over anhydrous Na₂SO₄ and evaporated to dryness. The crude product was collected and purified by column chromatography (SiO₂, ethyl acetate/n-hexane=1:5) to obtain a colorless solid (680 mg, yield: 69%).

Spectral data of ligand precursor L9: $^1$H NMR (400 MHz, CDCl₃, 298 K): δ 9.23 (s, 2H), 8.71 (m, 1H), 7.79 (dt, J=8.0, 1.2 Hz, 1H), 7.69 (dt, J=8.0, 1.2 Hz, 1H), 7.3 (m, 1H), 1.44 (s, 9H).

In an embodiment, ligand precursor L10 can be synthesized using the procedures listed below:

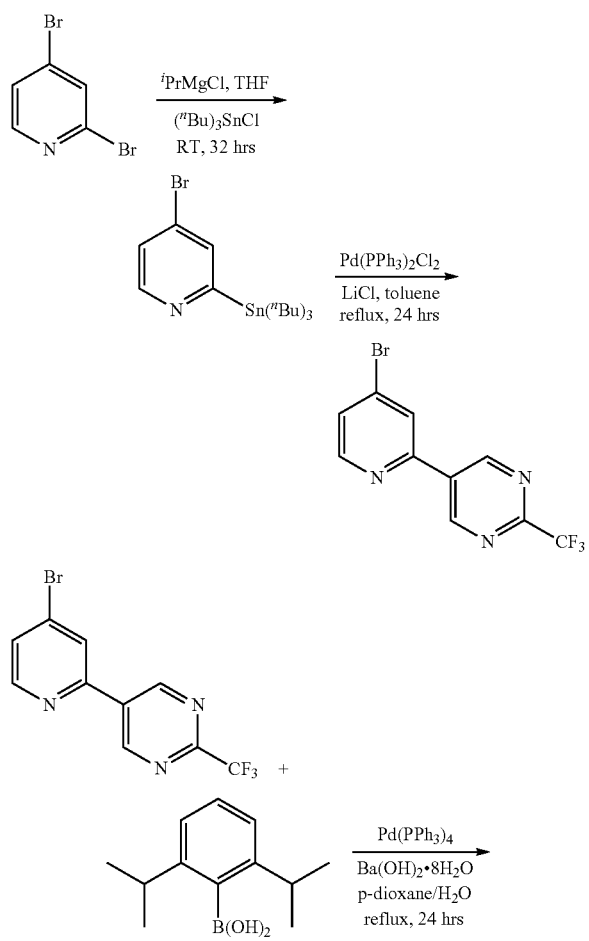

Spectral data of ligand precursor L10: $^1$H NMR (d$_6$-acetone, 400 MHz): δ 9.49 (s, 2H), 8.83 (d, J=4.8 Hz, 1H), 7.66 (s, 1H), 7.43 (t, J=7.8 Hz, 1H), 7.27~7.24 (m, 3H), 2.59 (septet, J=6.8 Hz, 2H), 1.11 (d, J=6.8 Hz, 12H). $^{19}$F NMR (d$_6$-acetone, 376 MHz): δ −70.21 (s, 3F, CF$_3$). FAB MS: m/z 385.2 [M$^+$].

In an embodiment, ligand precursor L12 can be synthesized using the procedures listed below:

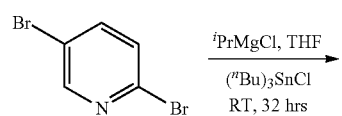

Step 1: 2,5-dibromopyridine (5.9 g, 2.5 mmol, 1 eq.) was placed in a Schlenk flask (N$_2$ atmosphere) and dry toluene (50 mL) was added. 2M solution of $^i$PrMgCl in THF (12.5 mL, 2.5 mmol, 1 eq.) was added drop by drop to the mixture and the resulting solution was stirred at room temperature for 1 hour. Further, the Tin reagent ($^n$Bu)$_3$SnCl (8 mL, 2.6 mmol, 1.1 eq.) was added drop by drop with stirring at room temperature for 36 hours. The mixture was quenched by adding 100 mL water and extracted using DCM. The organic layer was separated and dried over anhydrous Na$_2$SO$_4$. The solvent was removed under vacuum and the resulting 5-bromo-2-(tributylstannyl)pyridine was used for the next reaction step without purification.

Step 2: 2-trifluoromethyl-5-bromopyrimidine (1 g, 4.40 mmol, 1 eq.), 5-bromo-2-(tributylstannyl)pyridine (2.95 g, 6.60 mmol, 1.5 eq.), Pd(PPh$_3$)$_2$Cl$_2$ (0.155 g, 0.22 mmol, 0.05 eq.) and LiCl (0.56 g, 13.23 mmol, 3 eq.) were placed in a Schlenk flask (N$_2$ atmosphere) and the dry toluene (100 mL) was added. The reaction mixture was refluxed with stirring for 24 hours and cooled to room temperature. The mixture was quenched by adding 100 mL water and extracted using DCM. The organic layer was separated and dried using anhydrous Na$_2$SO$_4$, and the solvent was removed under vacuum. The crude product was collected and purified by column chromatography (SiO$_2$, ethyl acetate/n-hexane=1:3) to obtain a white solid (1.03 g, 3.38 mmol, yield: 51%).

Spectral data of the intermediate: $^1$H NMR (acetone-d$_6$, 400 MHz): δ 9.64 (s, 2H), 8.91 (m, 1H), 8.27 (m, 2H). $^{19}$F NMR (376 MHz, CDCl$_3$): δ −70.81 (s, 3H, CF$_3$).

Step 3: 5-(5-bromopyridin-2-yl)-2-(trifluoromethyl)pyrimidine (1.2 g, 3.95 mmol), 2,5-diisopropyl-phenylboronic acid (0.9 g, 4.35 mmol), Pd(PPh$_3$)$_4$ (250 mg, 0.28 mmol) and Ba(OH)$_2$·8H$_2$O (2.5 g, 13.05 mmol) were placed in a Schlenk flask (N$_2$ atmosphere) and the dry toluene (100 mL) was added. The reaction mixture was refluxed with stirring for 24 hours and cooled to room temperature. The mixture was quenched by adding 100 mL water and extracted using DCM. The organic layer was separated and dried using anhydrous Na$_2$SO$_4$. The solvent was removed under vacuum. The crude product was collected and purified by column chromatography (SiO$_2$, ethyl acetate/n-hexane=1:3) to obtain a white solid (0.8 g, 2.07 mmol, yield: 53%).

Spectral data of ligand precursor L12: $^1$H NMR (d$_6$-acetone, 400 MHz): δ 9.56 (s, 2H), 8.62 (d, J=2 Hz, 1H), 7.93 (d, J=8 Hz, 1H), 7.73 (dd, J=8 Hz, 1H), 7.41 (t, J=7.7 Hz, 1H), 7.27 (d, J=7.8 Hz, 2H), 2.59 (septet, J=6.8 Hz, 2H), 1.12 (d, J=6.8 Hz, 6H), 1.11 (d, J=6.8 Hz, 6H). $^{19}$F NMR (d$_6$-acetone, 376 MHz): δ−70.71 (s, 3F, CF$_3$). FAB MS: m/z 385.2 [M$^+$].

In an embodiment, ligand precursor L13 can be synthesized using the procedures listed below:

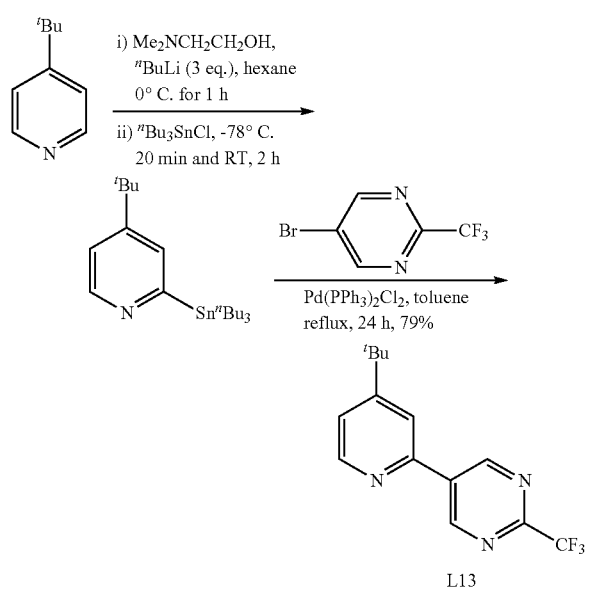

L13

Step 1: To a stirred solution of N,N-dimethylethanolamine (2.2 mL, 22.2 mmol, 1.5 eq.) in dry hexane (100 mL) at 0° C., $^n$BuLi (2.5 M in hexane, 17.8 mL, 44.4 mmol, 3 eq.) was added in a dropwise manner. The mixture was stirred for 20 minutes at 0° C. Then, 4-t-butylpyridine (2.17 mL, 14.8 mmol) was added and the mixture was stirred for 1 hour at the same temperature. After cooling to −78° C., $^n$Bu$_3$SnCl (8 mL, 29.6 mmol, 2 eq.) was added in a dropwise manner and the mixture was warmed to room temperature and stirred for 2 hours. The reaction was quenched with saturated NH$_4$Cl$_{(aq)}$ (100 mL) and extracted with ethyl acetate (2×50 mL). The combined organic layers were dried over Na$_2$SO$_4$ and concentrated in vacuum to yield crude 4-tert-butyl-2-(tributylstannyl)pyridine as a colorless oil. This crude product was used in the next step without further purification.

Step 2: 2-trifluoromethyl-5-bromopyrimidine (1.33 g, 5.86 mmol, 1 eq.), 4-tert-butyl-2-(tributylstannyl)pyridine (3.98 g, 9.38 mmol, 1.6 eq.), Pd(PPh$_3$)$_2$Cl$_2$ (0.21 g, 0.29 mmol, 0.05 eq.) and the dry toluene (100 mL) were placed in a Schlenk flask. The mixture was refluxed with stirring for 24 hours and cooled to room temperature. The mixture was quenched with 100 mL of water and extracted using ethyl acetate (2×50 mL). The organic layer was separated and dried using anhydrous Na$_2$SO$_4$. The solvent was removed under vacuum and the residue was purified by column chromatography (silica gel, hexane/ethyl acetate=4:1) to obtain a colorless solid (1.3 g, yield: 79%).

Spectral data of ligand precursor L13: $^1$H NMR (CDCl$_3$, 400 MHz): δ 9.43 (s, 2H), 8.66 (d, J=6.5 Hz, 1H), 7.73 (s, 1H), 7.38 (d, J=6.5 Hz, 1H), 1.37 (s, 9H). $^{19}$F NMR (CDCl$_3$, 376 MHz): δ−70.17 (s, 3F, CF$_3$).

In an embodiment, ligand precursor L14 can be synthesized using the procedures listed below:

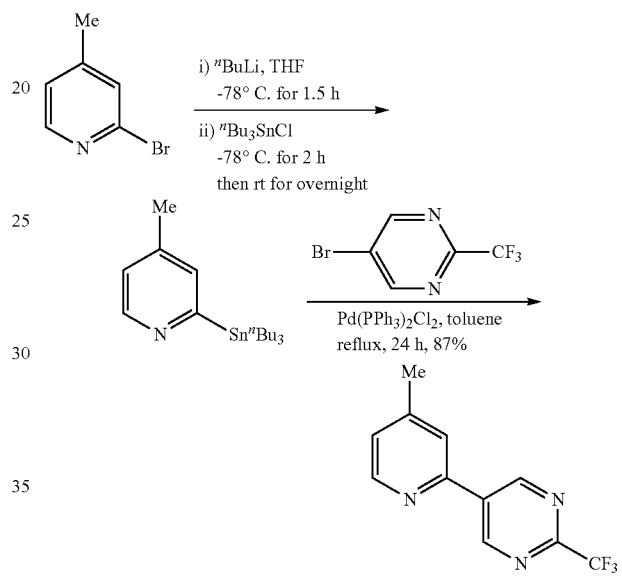

Step 1: To a solution of 2-bromopicoline (4.7 g, 27.3 mmol, 1 eq.) in tetrahydrofuran (100 mL), a 2.5 M solution of $^n$BuLi in hexane (10.9 mL, 27.3 mmol, 1 eq.) was added at −78° C. under N$_2$. After stirring for 1 hour, $^n$BuSnCl (7.41 mL, 27.3 mmol, 1 eq.) was added and stirred at −78° C. for 1 hour. Then, the reaction mixture was warmed to room temperature and stirred overnight. It was then quenched with saturated NH$_4$Cl$_{(aq)}$ (100 mL) and extracted with ethyl acetate (3×75 mL). The combined organic layers were dried using Na$_2$SO$_4$, and the solvent was removed under reduced pressure to obtain crude 2-tri-n-butylstannyl-4-picoline as a pale yellow oil. This crude product was used in the next step without any further purification.

Step 2: 2-trifluoromethyl-5-bromopyrimidine (3.7 g, 16.3 mmol, 1 eq.), 2-t-butylstannyl-4-picoline (10 g, 26.2 mmol, 1.6 eq.) and Pd(PPh$_3$)$_2$Cl$_2$ (0.57 g, 0.81 mmol, 0.05 eq.) were placed in a Schlenk flask and the dry toluene (100 mL) was added. The reaction mixture was refluxed with stirring for 24 hours and cooled to room temperature. The mixture was quenched by adding 100 mL water and extracted using ethyl acetate (2×75 mL). The organic layer was separated and dried using anhydrous Na$_2$SO$_4$. The solvent was removed under vacuum and the residue was purified by column chromatography (silica gel, hexane/ethyl acetate mixture=4:1) to obtain a colorless solid (3.39 g, yield: 87%).

Spectral data of ligand precursor L14: $^1$H NMR (CDCl$_3$, 400 MHz): δ 9.44 (s, 2H), 8.61 (d, J=4.8 Hz, 1H), 7.61 (s, 1H), 7.21 (d, J=4.8 Hz, 1H), 2.46 (s, 3H). $^{19}$F NMR (CDCl$_3$, 376 MHz): δ−70.19 (s, 3F, CF$_3$). FAB MS: m/z 239.10 [M$^+$].

In an embodiment, with the similar procedure reported for ligand precursor L14, ligand precursor L15 can be synthesized accordingly.

Spectral data of ligand precursor L15: $^1$H NMR (CDCl$_3$, 400 MHz): δ 9.50 (s, 2H), 8.97 (d, J=5 Hz, 1H), 8.00 (s, 1H), 7.63 (d, J=5 Hz, 1H). $^{19}$F NMR (CDCl$_3$, 376 MHz): δ−64.87 (s, 3F, CF$_3$), −70.29 (s, 3F, CF$_3$). MS(EI): m/z 293.0 [M$^+$].

People having ordinary skill in the art can select suitable reactants and reaction conditions according to the changes of each chelating ligand precursor, and the reaction preparation method can be modified based on a known technique in the art, so the details are not repeated herein.

Synthesis of Platinum Complexes

The platinum complex of the invention can be obtained via, for instance, a one-step method:

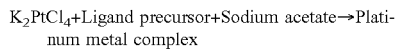

K$_2$PtCl$_4$+Ligand precursor+Sodium acetate→Platinum metal complex

The specific method includes the following steps. A ligand precursor, sodium acetate and a platinum source are mixed and heat refluxed in a suitable solvent such as acetic acid, carboxylic acid or another solvent with high a high boiling point. After completion of the reaction, the crude product is purified to obtain the platinum complex of the invention.

The platinum complex of the invention can be obtained via, for instance, a two-step method:

K$_2$PtCl$_4$+Ligand precursor+Sodium acetate→Another ligand precursor→Platinum metal complex The specific method includes the following steps. A ligand precursor, sodium acetate and a platinum source are mixed and heat refluxed in a suitable solvent for a period of time. Another ligand precursor is then added to the mixture and heat refluxed together for another period of time. After completion of the reaction, the crude product is purified to obtain the platinum complex of the invention.

The platinum complex of the invention can be prepared by adopting suitable reactants and reaction conditions according to changes of each chelating ligand, and the reaction preparation method can be modified based on a known technique in the art, and the details are not repeated herein.

EXAMPLES

In the following, several examples are provided to further describe the invention, but the examples are only exemplary and are not intended to limit the scope of the invention. The platinum complexes represented by formulas (IA-1), (IA-2), (IA-3) . . . , or (IB-1), (IB-2), (IB-3) . . . are abbreviated as compounds (IA-1), (IA-2), (IA-3) . . . , or (IB-1), (IB-2), (IB-3) . . . hereinafter. The abbreviation also applies to platinum complexes represented by other chemical structures in the following.

Example 1: Preparation of Compound (IA-1)

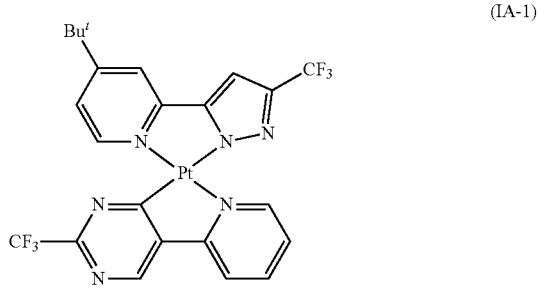

(IA-1)

A mixture of K$_2$PtCl$_4$ (300 mg, 0.723 mmol), ligand precursor L7 (163 mg, 0.723 mmol) and sodium acetate (2.37 g, 28.9 mmol) in 50 mL of glacial acetic acid was refluxed for 2 hours and then cooled to room temperature. Ligand precursor L1 (195 mg, 0.723 mmol) was added and the mixture was further refluxed for 2 hours. The solvent was removed under vacuum and the obtained powder was washed with water, ethyl acetate and CH$_2$Cl$_2$ in sequence. A dark green solid (276 mg, yield: 56%) was obtained after vacuum sublimation.

Spectral data of compound (IA-1): $^1$H NMR (500 MHz, d$_6$-DMSO, 323 K): δ 10.61 (s, 2H), 9.12 (s, 1H), 8.41 (d, J=8.0 Hz, 1H), 8.33 (t, J=8.0 Hz, 1H), 8.08 (s, 1H), 7.76 (t, J=6.5 Hz, 1H), 7.52 (d, J=6.5 Hz, 1H), 7.43 (s, 1H), 1.42 (s, 9H). $^{19}$F NMR (470 MHz, d$_6$-DMSO, 323 K): δ−59.55 (s, 3F), −69.44 (s, 3F). FD MS: m/z 687.2 (M$^+$). Anal. Calcd. for C$_{23}$H$_{18}$F$_6$N$_6$Pt: C, 40.18; H, 2.64; N, 12.22. Found: C, 40.27; H, 2.29; N, 12.22.

Example 2: Preparation of Compound (IA-2)

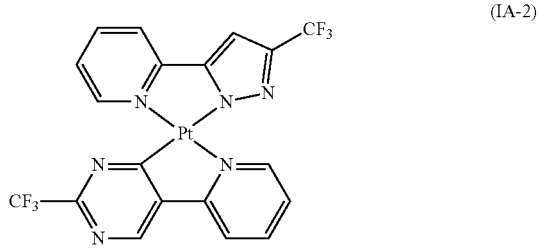

(IA-2)

Similar to the synthetic procedure of compound (IA-1), the reaction of K$_2$PtCl$_4$ (100 mg, 0.241 mmol), ligand precursor L7 (54.3 mg, 0.241 mmol) and sodium acetate (790 mg, 9.64 mmol) in 15 mL of glacial acetic acid was carried out, followed by treatment with ligand precursor L2 (51.4 mg, 0.241 mmol) and vacuum sublimation. A dark brown solid (81 mg, 53%) was then obtained.

Spectral data of compound (IA-2): $^1$H NMR (400 MHz, d$_7$-DMF, 298 K): δ 10.45 (d, J=5.2 Hz, 1H), 10.28 (d, J=5.2 Hz, 1H), 8.84 (s, 1H), 8.24~8.17 (m, 2H), 8.1 (td, J=7.6, 1.2 Hz, 1H), 7.8 (d, J=7.2 Hz, 1H), 7.47~7.44 (m, 1H), 7.31~7.27 (m, 1H), 6.96 (s, 1H). $^{19}$F NMR (376 MHz, d$_7$-DMF, 298 K): δ−60.23 (s, 3F), −69.99 (s, 3F). FD MS: m/z 631.1 (M$^+$). Anal. Calcd. for C$_{19}$H$_{10}$F$_6$N$_6$Pt: C, 36.14; H, 1.60; N, 13.31. Found: C, 36.25; H, 1.68; N, 13.56.

Example 3: Preparation of Compound (IA-3)

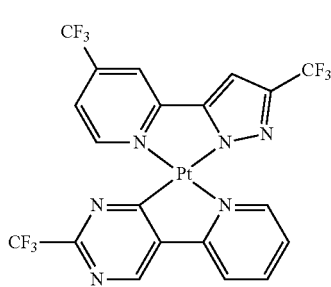
(IA-3)

Similar to the synthetic procedure of compound (IA-1), the reaction of K$_2$PtCl$_4$ (300 mg, 0.723 mmol), ligand precursor L7 (163 mg, 0.723 mmol) and sodium acetate (2.37 g, 28.9 mmol) in 50 mL of glacial acetic acid was carried out, followed by treatment with ligand precursor L3 (203 mg, 0.723 mmol) and vacuum sublimation. A dark green solid (304 mg, yield: 60%) was then obtained.

Spectral data of compound (IA-3): $^1$H NMR (500 MHz, d$_7$-DMF, 323 K): δ 10.85 (s, 1H), 10.37 (s, 1H), 8.96 (s, 1H), 8.37 (s, 1H), 8.31~8.28 (m, 2H), 7.72 (s, 1H), 7.58 (s, 1H), 7.36 (s, 1H). $^{19}$F NMR (470 MHz, d$_7$-DMF, 323 K): δ −61.08 (s, 3F), −65.83 (s, 3F), −70.67 (s, 3F). FD MS: m/z 699.1 (M$^+$). Anal. Calcd. for C$_{20}$H$_9$F$_9$N$_6$Pt: C, 34.35; H, 1.30; N, 12.02. Found: C, 34.35; H, 1.64; N, 12.05.

Example 4: Preparation of Compound (IA-4)

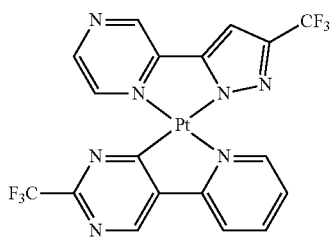
(IA-4)

Similar to the synthetic procedure of compound (IA-1), the reaction of K$_2$PtCl$_4$ (100 mg, 0.241 mmol), ligand precursor L7 (54.3 mg, 0.241 mmol) and sodium acetate (790 mg, 9.64 mmol) in 15 mL of glacial acetic acid was carried out, followed by treatment with ligand precursor L4 (51.6 mg, 0.241 mmol) and vacuum sublimation. A dark green solid (74 mg, yield: 48%) was then obtained.

Spectral data of compound (IA-4): $^1$H NMR (500 MHz, d$_6$-DMSO, 323 K): δ 10.63 (s, 1H), 10.40 (s, 1H), 9.36 (s, 1H), 9.09 (s, 1H), 8.76 (s, 1H), 8.39 (d, J=8.0 Hz, 1H), 8.33 (t, J=8.0 Hz, 1H), 7.75 (t, J=6.5 Hz, 1H), 7.39 (s, 1H). $^{19}$F NMR (470 MHz, d$_6$-DMSO, 323 K): δ −59.71 (s, 3F), −69.48 (s, 3F). FD MS: m/z 632.1 (M$^+$). Anal. Calcd. for C$_{18}$H$_9$F$_6$N$_7$Pt: C, 34.19; H, 1.43; N, 15.50. Found: C, 34.20; H, 1.30; N, 15.54.

Example 5: Preparation of Compound (IA-5)

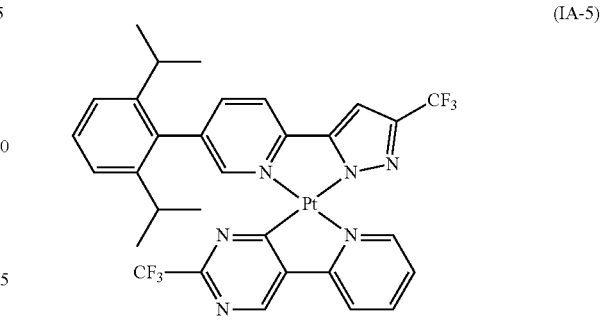
(IA-5)

Similar to the synthetic procedure of compound (IA-4), the reaction of K$_2$PtCl$_4$ (100 mg, 0.241 mmol), ligand precursor L7 (54.3 mg, 0.241 mmol) and sodium acetate (790 mg, 9.64 mmol) in 15 mL of glacial acetic acid was carried out, followed by treatment with ligand precursor L5 (90 mg, 0.241 mmol). A yellow solid (116 mg, yield: 61%) was then obtained. Single crystals can be obtained by cooling of the saturated solution of ethyl acetate.

Spectral data of compound (IA-5): $^1$H NMR (400 MHz, CDCl$_3$, 298 K): δ 11.09 (d, J=1.6 Hz, 1H), 11.03 (d, J=5.2 Hz, 1H), 8.66 (s, 1H), 8.08 (td, J=8.0, 1.6 Hz, 1H), 7.88 (d, J=8.0 Hz, 1H), 7.81 (dd, J=7.8, 1.6 Hz, 1H), 7.76 (d, J=7.8 Hz, 1H), 7.63~7.60 (m, 1H), 7.45 (t, J=8.0 Hz, 1H), 7.27 (d, J=8.0 Hz, 2H), 6.97 (s, 1H), 2.58~2.51 (m, 2H), 1.11 (d, J=6.8 Hz, 6H), 1.05 (d, J=6.8 Hz, 6H). $^{19}$F NMR (376 MHz, d$_6$-acetone, 298 K): δ −60.77 (s, 3F), −70.96 (s, 3F). FD MS: m/z 791.1 (M$^+$). Anal. Calcd. for C$_{31}$H$_{26}$F$_6$N$_6$Pt: C, 47.03; H, 3.31; N, 10.62. Found: C, 47.39; H, 3.52; N, 10.53.

Example 6: Preparation of Compound (IA-6)

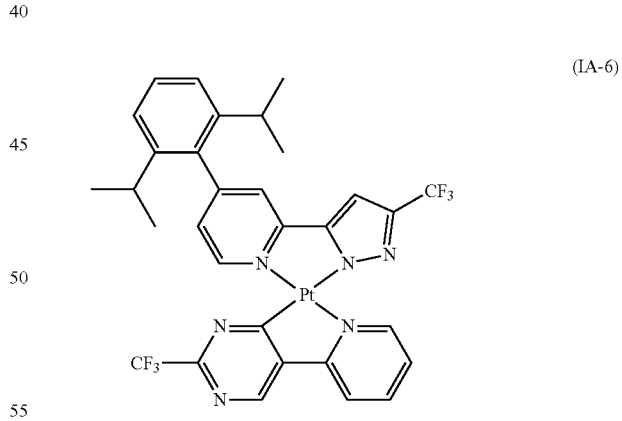
(IA-6)

Similar to the synthetic procedure of compound (IA-4), the reaction of K$_2$PtCl$_4$ (100 mg, 0.241 mmol), ligand precursor L6 (54.3 mg, 0.241 mmol) and sodium acetate (790 mg, 9.64 mmol) in 15 mL of glacial acetic acid was carried out, followed by treatment with ligand precursor L7 (90 mg, 0.241 mmol). A yellow solid (129 mg, yield: 68%) was then obtained after recrystallization.

Spectral data of compound (IA-6): $^1$H NMR (400 MHz, d$_7$-DMF, 298 K): δ 11.06 (d, J=6.4 Hz, 1H), 10.89 (d, J=5.6 Hz, 1H), 9.31 (s, 1H), 8.61 (d, J=7.6 Hz, 1H), 8.45 (dt, J=7.6, 1.2 Hz, 1H), 8.29 (d, J=1.6 Hz, 1H), 7.91~7.87 (m, 1H), 7.68

(dd, J=5.6, 2.0 Hz, 1H), 7.61 (s, 1H), 7.52 (d, J=7.6 Hz, 1H), 7.39 (d, J=7.6 Hz, 2H), 2.62~2.65 (m, 2H), 1.17 (d, J=11.6 Hz, 6H), 1.15 (d, J=11.6 Hz, 6H). $^{19}$F NMR (376 MHz, d$_6$-DMSO, 298 K): δ −60.41 (s, 3F), −70.17 (s, 3F).

Example 7: Preparation of Compound (IA-7)

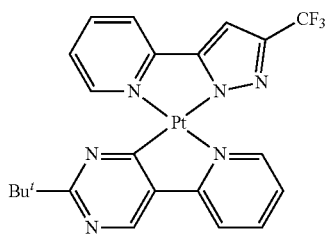

(IA-7)

The compound (IA-7) was synthesized by a two-step method.

Step 1: K$_2$PtCl$_4$ (100 mg, 0.24 mmol, 1 eq.), ligand precursor L9 (52 mg, 0.24 mmol, 1 eq.) and sodium acetate (0.79 g, 9.6 mmol, 40 eq.) were placed in a flask in N$_2$ atmosphere. The acetic acid (10 mL) was added to the mixture and the resulting solution was refluxed for 12 hours. The reaction mixture was cooled to room temperature and the solvent was removed under vacuum. The residue was dissolved in DMSO (5 mL) and 0.5 mL of water was added. The resulting clear solution was stirred at 80° C. for 24 hours. The reaction mixture was cooled to room temperature and the solvent was removed under vacuum. The residue was thoroughly washed by water and dried under vacuum.

Step 2: The resulting crude product Pt(DMSO)(L9)Cl (81 mg, 0.16 mmol, 1 eq.), ligand precursor L2 (34 mg, 0.16 mmol, 1 eq.) and sodium acetate (0.52 g, 6.4 mmol, 40 eq.) were placed in a flask in N$_2$ atmosphere. The acetic acid (10 mL) was added the mixture and the resulting solution was refluxed for 12 hours. The reaction mixture was cooled to room temperature and the solvent was removed under vacuum. The resulting crude product was collected and thoroughly washed by water and ethyl acetate. The resulting precipitate was dried under vacuum to obtain a dark-green solid (36 mg, 0.06 mmol, yield: 24%).

Spectral data of compound (IA-7): $^1$H NMR (d$_6$-DMSO, 400 MHz, 298 K): 11.13 (d, J=5.6 Hz, J$_{PtH}$=41 Hz, 1H), 10.37 (d, J=5.6 Hz, J$_{PtH}$=33 Hz, 1H), 8.72 (s, 1H), 8.18~8.10 (m, 3H), 7.94 (d, J=8 Hz, 1H), 7.48 (t, J=6.4 Hz, 1H), 7.39 (t, J=6.6 Hz, 1H), 7.19 (s, 1H), 1.50 (s, 9H). $^{19}$F NMR (d$_6$-DMSO, 298 MHz): δ−58.86 (s, 3F, CF$_3$).

Example 8: Preparation of Compound (IA-8)

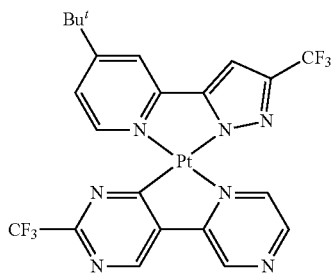

(IA-8)

A mixture of K$_2$PtCl$_4$ (100 mg, 0.241 mmol), ligand precursor L8 (54.3 mg, 0.241 mmol) and sodium acetate (790 mg, 9.64 mmol) in 15 mL of pivalic acid was refluxed for 12 hours. The solution was evaporated to dryness and the residue was washed with water, ethyl acetate and CH$_2$Cl$_2$ in sequence. This residual solid, together with ligand precursor L1 (64.9 mg, 0.241 mmol) and sodium acetate (79 mg, 0.96 mmol) in 15 mL of pivalic acid, was refluxed for 2 hours and then cooled to room temperature. The solvent was removed for the second time under vacuum. The obtained powder was washed with water, ethyl acetate and CH$_2$Cl$_2$ in sequence, giving a dark red powder (96 mg).

Example 9: Preparation of Compound (IA-9)

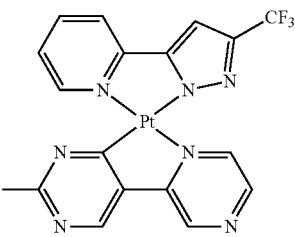

(IA-9)

A mixture of K$_2$PtCl$_4$ (100 mg, 0.241 mmol), ligand precursor L8 (54.3 mg, 0.241 mmol) and sodium acetate (790 mg, 9.64 mmol) in 15 mL of pivalic acid was refluxed for 12 hours. The solution was evaporated to dryness and the residue was washed with water, ethyl acetate and CH$_2$Cl$_2$ in sequence. This residual solid, together with ligand precursor L2 (51 mg, 0.24 mmol) and sodium acetate (79 mg, 0.96 mmol) in 15 mL of pivalic acid, was refluxed for 2 hours and then cooled to room temperature. The solvent was removed for the second time under vacuum. The obtained powder was washed with water, ethyl acetate and CH$_2$Cl$_2$ in sequence, giving a dark green powder (88 mg).

Example 10: Preparation of Compound (IA-10)

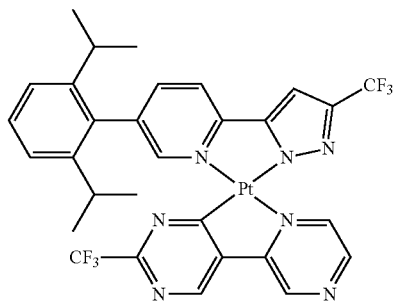

(IA-10)

A mixture of K$_2$PtCl$_4$ (100 mg, 0.241 mmol), ligand precursor L8 (54.3 mg, 0.241 mmol) and sodium acetate (790 mg, 9.64 mmol) in 15 mL of pivalic acid was refluxed for 12 hours and then cooled to room temperature. Ligand precursor L5 (90 mg, 0.241 mmol) was added and the mixture was further refluxed for 2 hours. The solvent was removed under vacuum and the residue was dissolved in ethyl acetate. The solution was washed with water and dried over anhydrous Na$_2$SO$_4$. Yellow solid (93 mg, yield: 49%) was obtained upon evaporation of solution to dryness.

Spectral data of compound (IA-10): $^1$H NMR (400 MHz, d$_6$-acetone, 298 K): δ 11.08 (d, J=1.6 Hz, 1H), 10.97 (dd, J=3.2, 0.8 Hz, 1H), 9.71 (s, 1H), 9.28 (s, 1H), 9.04 (d, J=3.2 Hz, 1H), 8.24 (d, J=8.0 Hz, 1H), 8.15 (dd, J=8.0, 1.6 Hz, 1H), 7.48 (t, J=7.6 Hz, 1H), 7.35 (s, 1H), 7.33 (d, J=3.2 Hz, 2H), 2.69~2.62 (m, 2H), 1.13 (d, J=6.8 Hz, 6H), 1.08 (d, J=6.8 Hz, 6H). $^{19}$F NMR (376 MHz, d$_6$-acetone, 298 K): δ −61.17 (s, 3F), −71.27 (s, 3F). FD MS: m/z 792.1 (M$^+$). Anal. Calcd. for C$_{30}$H$_{25}$F$_6$N$_7$Pt: C, 45.46; H, 3.18; N, 12.37. Found: C, 45.30; H, 3.19; N, 12.36.

Example 11: Preparation of Compound (IA-11)

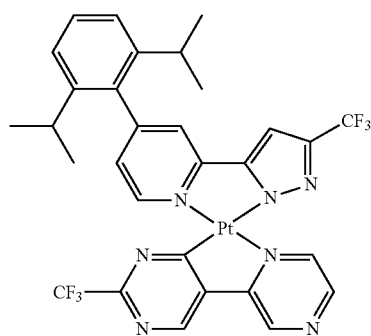

(IA-11)

A mixture of K$_2$PtCl$_4$ (100 mg, 0.241 mmol), ligand precursor L8 (54.3 mg, 0.241 mmol) and sodium acetate (790 mg, 9.64 mmol) in 15 mL of pivalic acid was refluxed for 12 hours and then cooled to room temperature. Ligand precursor L6 (90 mg, 0.241 mmol) was added and the mixture was further refluxed for 2 hours. The solvent was removed under vacuum and the residue was dissolved in ethyl acetate. The solution was washed with water and dried over anhydrous Na$_2$SO$_4$. An orange solid (85 mg, yield: 45%) was obtained upon evaporation of solution to dryness.

Spectral data of compound (IA-11): $^1$H NMR (500 MHz, d$_6$-DMSO, 350 K): δ 10.83 (d, J=6.5 Hz, 1H), 10.70 (d, J=3.0 Hz, 1H), 9.74 (s, 1H) 9.34 (s, 1H), 9.05 (d, J=3.0 Hz, 1H), 8.12 (s, 1H), 7.5~7.44 (m, 3H), 7.32 (d, J=8 Hz, 2H), 2.59 (septet, J=7 Hz, 2H), 1.13 (d, J=6.6 Hz, 6H), 1.12 (d, J=6.6 Hz, 6H). $^{19}$F NMR (376 MHz, d$_6$-DMSO, 298 K): δ −59.29 (s, 3F), −69.20 (s, 3F).

Example 12: Preparation of Compound (IA-17)

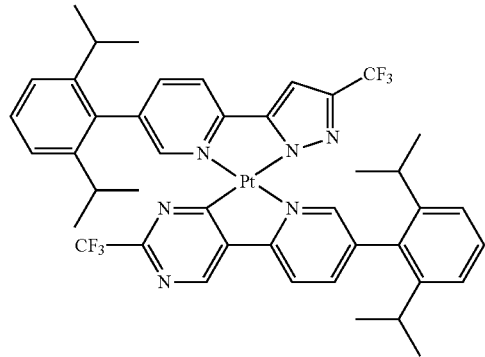

(IA-17)

K$_2$PtCl$_4$ (54 mg, 0.13 mmol, 1 eq.), ligand precursor L12 (50 mg, 0.13 mmol, 1 eq.) and sodium acetate (426 mg, 5.19 mmol, 40 eq.) were placed in a 50 mL flask in N$_2$ atmosphere. The acetic acid (10 mL) was added the mixture and the resulting solution was refluxed for 2 hours. Ligand precursor L5 (47 mg, 0.13 mmol, 1 eq.) was added to the mixture and refluxed with stirring for 20 hours. The solvent was removed under vacuum and the residue was purified by column chromatography (SiO$_2$, n-hexane/ethyl acetate=9:1) to obtain a green solid (79 mg, 0.08 mmol, yield: 64%).

Spectral data of compound (IA-17): $^1$H NMR (d$_6$-acetone, 400 MHz): δ 11.14 (d, J=2 Hz, J$_{PtH}$=50 Hz, 1H), 10.98 (d, J=1.6 Hz, J$_{PtH}$=39 Hz, 1H), 9.12 (s, 1H), 8.51 (d, J=8.1 Hz, 1H), 8.23~8.17 (m, 2H), 8.11 (dd, J=8.0 Hz, 1H), 7.49~7.44 (m, 2H), 7.36 (t, J=7.7 Hz, 4H), 7.22 (s, 1H), 2.72 (septet, J=6.8 Hz, 2H), 2.71 (septet, J=6.8 Hz, 2H), 1.15 (d, J=6.4 Hz, 12H), 1.13 (d, J=6.8 Hz, 6H), 1.09 (d, J=6.8 Hz, 6H). $^{19}$F NMR (d$_6$-acetone, 376 MHz): δ −61.49 (s, 3F, CF$_3$), −71.11 (s, 3F, CF$_3$). FAB MS: m/z 951.3 [M$^+$].

Example 13: Preparation of Compound (IA-18)

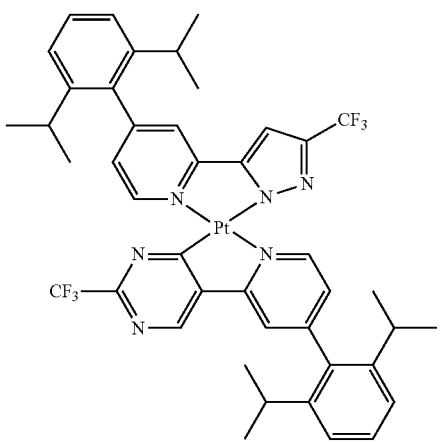

(IA-18)

K$_2$PtCl$_4$ (54 mg, 0.13 mmol, 1 eq.), ligand precursor L10 (50 mg, 0.13 mmol, 1 eq.) and sodium acetate (426 mg, 5.19 mmol, 40 eq.) were placed in a 50 mL flask in N$_2$ atmosphere. The acetic acid (10 mL) was added to the mixture and the resulting solution was refluxed for 2 hours. Ligand precursor L6 (47 mg, 0.13 mmol, 1 eq.) was added to the mixture and refluxed with stirring for 16 hours. The solvent was removed under vacuum and the residue was purified by column chromatography (SiO$_2$, n-hexane/ethyl acetate=9:1) to obtain a red solid (35 mg, 0.03 mmol, yield: 28%).

Spectral data of compound (IA-18): $^1$H NMR (d$_6$-acetone, 400 MHz): δ 11.16 (d, J=6.1 Hz, J$_{PtH}$=45 Hz, 1H), 11.02 (d, J=6.0 Hz, J$_{PtH}$=35 Hz, 1H), 9.27 (s, $^1$H), 8.41 (d, J=1.6 Hz, 1H), 8.07 (d, J=2 Hz, 1H), 7.74 (dd, J=2 Hz, 1H), 7.53~7.50 (m, 1H), 7.46 (t, J=7.6 Hz, 2H), 7.39~7.34 (m, 5H), 2.75 (septet, J=6.8 Hz, 2H), 2.74 (septet, J=6.8 Hz, 2H), 1.18 (d, J=6.8 Hz, 12H), 1.16 (d, J=5.2 Hz, 6H), 1.15 (d, J=2.8 Hz, 6H). $^{19}$F NMR (d$_6$-acetone, 376 MHz): δ−61.05 (s, 3F, CF$_3$), −70.83 (s, 3F, CF$_3$). FAB MS: m/z 951.3 [M$^+$].

Example 14: Preparation of Compound (IA-19)

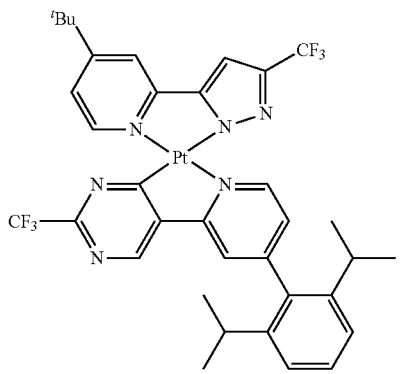

(IA-19)

K$_2$PtCl$_4$ (54 mg, 0.13 mmol, 1 eq.), ligand precursor L10 (50 mg, 0.13 mmol, 1 eq.) and sodium acetate (426 mg, 5.19 mmol, 40 eq.) were placed in a 50 mL flask in N$_2$ atmosphere. The acetic acid (10 mL) was added to the mixture and the resulting solution was refluxed for 2 hours. Ligand precursor L1 (35 mg, 0.13 mmol, 1 eq.) was added to the mixture and refluxed with stirring for 17 hours. The solvent was removed under vacuum and the residue was purified by column chromatography (SiO$_2$, n-hexane/ethyl acetate=9:1) to obtain a red solid (32 mg, 0.04 mmol, yield: 29%).

Spectral data of compound (IA-19): $^1$H NMR (d$_6$-acetone, 400 MHz): δ 10.50 (d, J=5.6 Hz, J$_{PtH}$=40 Hz, 1H), 10.45 (d, J=6.4 Hz, J$_{PtH}$=30 Hz, 1H), 8.99 (s, $^1$H), 8.21 (s, 1H), 7.79 (s, 1H), 7.49 (t, J=7.8 Hz, 1H), 7.41~7.28 (m, 3H), 7.18 (d, J=2.4 Hz, 1H), 6.79 (s, 1H), 2.78 (septet, J=6.4 Hz, 2H), 1.20 (d, J=6.8 Hz, 12H). $^{19}$F NMR (d$_6$-acetone, 376 MHz): δ −60.61 (s, 3F, CF$_3$), −70.35 (s, 3F, CF$_3$). FAB MS: m/z 847.2 [M$^+$].

Example 15: Preparation of Compound (IA-20)

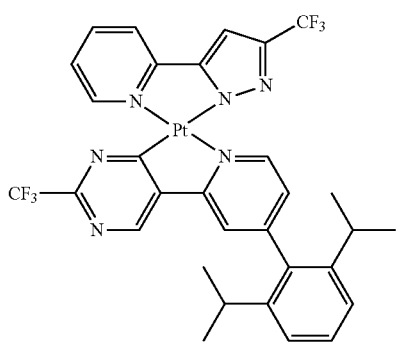

(IA-20)

K$_2$PtCl$_4$ (54 mg, 0.13 mmol, 1 eq.), ligand precursor L10 (50 mg, 0.13 mmol, 1 eq.) and sodium acetate (426 mg, 5.19 mmol, 40 eq.) were placed in a 50 mL flask in N$_2$ atmosphere. The acetic acid (10 mL) was added to the mixture and the resulting solution was refluxed for 12 hours. Ligand precursor L2 (30 mg, 0.13 mmol, 1 eq.) was added to the mixture and refluxed with stirring for 4 hours. The precipitate was collected by filtration and thoroughly washed with water/hexane, giving a green solid (51 mg, 0.06 mmol, yield: 49%).

Spectral data of compound (IA-20): $^1$H NMR (d$_6$-DMSO, 400 MHz): δ 10.52 (d, J=5.6 Hz, J$_{PtH}$=46 Hz, 1H), 10.32 (d, J=6.0 Hz, J$_{PtH}$=35 Hz, 1H), 9.07 (s, 1H), 8.33 (d, J=0.8 Hz, 1H), 8.04 (t, J=7.2 Hz, 1H), 7.73 (d, J=7.6 Hz, 1H), 7.49~7.43 (m, 2H), 7.34 (d, J=7.6 Hz, 2H), 7.21 (t, J=6.2 Hz, 1H), 6.95 (s, 1H), 2.57 (septet, J=6.8 Hz, 2H), 1.14 (d, J=6.4 Hz, 6H), 1.12 (d, J=6.4 Hz, 6H). $^{19}$F NMR (d$_6$-DMSO, 376 MHz): δ −59.08 (s, 3F, CF$_3$), −69.16 (s, 3F, CF$_3$). FAB MS: m/z 791.2 [M$^+$].

Example 16: Preparation of Compound (IA-21)

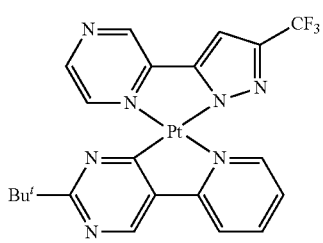

(IA-21)

The compound (IA-21) was synthesized by a two-step method.

Step 1: K$_2$PtCl$_4$ (150 mg, 0.39 mmol, 1 eq.), ligand precursor L9 (83 mg, 0.39 mmol, 1 eq.) and sodium acetate (1.27 g, 15.6 mmol, 40 eq.) were placed in a 50 mL flask in N$_2$ atmosphere. The acetic acid (10 mL) was added to the mixture and the resulting solution was refluxed for 12 hours. The reaction mixture was cooled to room temperature and the solvent was removed under vacuum. The residue was dissolved in DMSO (5 mL) and 0.5 mL of water was added. The resulting clear solution was stirred at 80° C. for 24 hours. The reaction mixture was cooled to room temperature and the solvent was removed under vacuum. The residue was thoroughly washed by water and dried under vacuum.

Step 2: The resulting crude product Pt(DMSO)L9Cl (150 mg, 0.28 mmol, 1 eq.), ligand precursor L4 (60 mg, 0.28 mmol, 1 eq.) and sodium acetate (0.92 g, 11.2 mmol, 40 eq.) were placed in a flask in N$_2$ atmosphere. The acetic acid (10 mL) was added the mixture and the resulting solution was refluxed for 12 hours. The reaction mixture was cooled to room temperature and the precipitate was collected by filtration. The precipitate was thoroughly washed by water and ethyl acetate and the precipitate was dried under vacuum to obtain a dark-green solid (71 mg, 0.11 mmol, yield: 28%).

Spectral data of compound (IA-21): $^1$H NMR (d$_6$-DMSO, 500 MHz, 353 K): δ 11.27 (d, J=3.5 Hz, J$_{PtH}$=45 Hz, 1H), 10.47 (d, J=6 Hz, J$_{PtH}$=31 Hz, 1H), 9.40 (d, J=0.5 Hz, 1H), 8.88 (s, 1H), 8.82 (d, J=3 Hz, 1H), 8.25~8.22 (m, 2H), 7.69~7.66 (m, 1H), 7.45 (s, 1H), 1.53 (s, 9H). $^{19}$F NMR (d$_6$-DMSO, 470.6 MHz, 353 K): δ−59.23 (s, 3F, CF$_3$). FAB MS: m/z 620.1 [M$^+$].

Example 17: Preparation of Compound (IA-22)

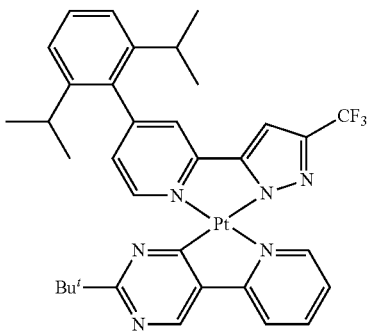

(IA-22)

K$_2$PtCl$_4$ (100 mg, 0.24 mmol, 1 eq.), ligand precursor L9 (52 mg, 0.24 mmol, 1 eq.) and sodium acetate (0.79 g, 9.6 mmol, 40 eq.) were placed in a flask in N$_2$ atmosphere. The acetic acid (10 mL) was added to the mixture and the resulting solution was refluxed for 12 hours. Ligand precursor L6 (89 mg, 0.24 mmol, 1 eq.) was added to the mixture and refluxed with stirring for 12 hours. The solvent was removed under vacuum and the resulting residue was purified by column chromatography (SiO$_2$, n-hexane/ethyl acetate=2:1) to obtain an orange solid (42 mg, 0.05 mmol, yield: 22%).

Spectral data of compound (IA-22): $^1$H NMR (d$_6$-acetone, 400 MHz): δ 11.37 (d, J=6 Hz, J$_{PtH}$=45 Hz, 1H), 10.67 (d, J=5.8 Hz, J$_{PtH}$=33 Hz, 1H), 8.62 (s, 1H), 8.12 (t, J=7.3 Hz, 1H), 8.01 (d, J=8 Hz, 1H), 7.88 (d, J=1.8 Hz, 1H), 7.47 (t, J=5.6 Hz, 1H), 7.40 (t, J=6.3 Hz, 1H), 7.34~7.32 (m, 3H), 7.22 (s, 1H), 2.75 (septet, J=7.2 Hz, 2H), 1.52 (s, 9H), 1.18 (d, J=6.8 Hz, 6H), 1.16 (d, J=6.9 Hz, 6H). $^{19}$F NMR (d$_6$-acetone, 376 MHz): δ−60.75 (s, 3F, CF$_3$).

Example 18: Preparation of Compounds (IB-1) and (IIB-1)

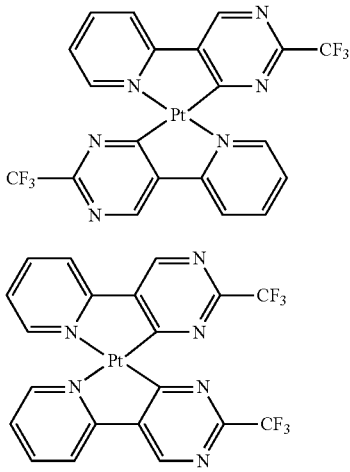

(IB-1)

(IIB-1)

K$_2$PtCl$_4$ (0.5 g, 1.2 mmol, 1 eq.), ligand precursor L7 (0.54 g, 2.4 mmol, 2 eq.) and KOAc (4.73 g, 48.2 mmol, 40 eq.) were placed in a two-neck round-bottom flask fitted with refluxing condenser. Pivalic acid (15 mL) was added thereto and reaction mixture was refluxed for 24 hours under N$_2$. Dark green precipitate was formed during reflux. Then, the reaction mixture was cooled to room temperature and deionized water (20 mL) was added. The solid was collected by filtration and thoroughly washed with water, ethyl acetate and CH$_2$Cl$_2$ in sequence, and dried under vacuum to obtain a dark green solid (0.605 g, yield: 78%). It was further purified by sublimation (290° C., 10$^{-5}$ mmHg) to obtain a dark green solid (0.48 g, yield: 80%). $^{19}$F NMR analysis confirms that obtained solid contains a mixture of trans- and cis-isomers in approx. 94.4% (IB-1) and 5.6% (IIB-1).

Spectral data of compound (IB-1): $^1$H NMR (500 MHz, d$_7$-DMF, 350 K): δ 11.31 (d, J=6 Hz, J$_{PtH}$=46 Hz, 2H), 9.26 (s, 2H), 8.46 (d, J=7.5 Hz, 2H), 8.34 (t, J=7.5 Hz, 2H), 7.74 (t, J=7.5 Hz, 2H). $^{19}$F NMR (470 MHz, d$_7$-DMF, 350 K): δ−70.32 (s, 3F, CF$_3$). FD MS: m/z 643.1 (M$^+$). Anal. Calcd. for C$_{18}$H$_{19}$F$_6$N$_7$Pt: C, 37.34; H, 1.57; N, 13.06. Found: C, 37.29; H, 1.60; N, 13.03.

Spectral data of compound (IIB-1): $^1$H NMR (500 MHz, d$_6$-DMSO, 350 K): δ 9.06 (d, J=6 Hz, 2H), 9.02 (s, 2H), 8.40 (d, J=7.5 Hz, 2H), 8.27 (t, J=7.5 Hz, 2H), 7.79 (t, J=6 Hz, 2H). $^{19}$F NMR (470 MHz, d$_6$-DMSO, 350 K): δ−68.89 (s, 3F, CF$_3$).

Example 19: Preparation of Compounds (IB-2) and (IIB-2)

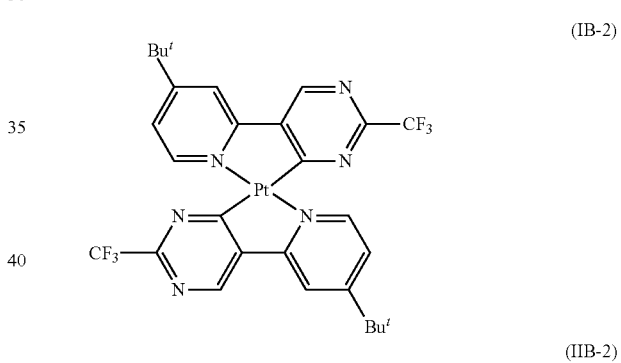

(IB-2)

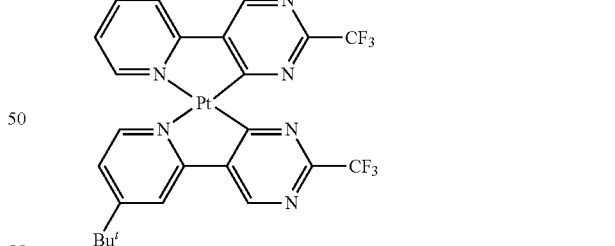

(IIB-2)

K$_2$PtCl$_4$ (0.5 g, 1.2 mmol, 1 eq.), ligand precursor L13 (0.78 g, 2.4 mmol, 2 eq.) and KOAc (4.73 g, 48.2 mmol, 40 eq.) were placed in a two-neck round-bottom flask fitted with refluxing condenser. Pivalic acid (16 mL) was added thereto and reaction mixture was refluxed for 24 hours under N$_2$. Dark green precipitate was formed during reflux. Then, the reaction mixture was cooled to room temperature and deionized water (20 mL) was added. The solid was collected by filtration and thoroughly washed with water, ethyl acetate and CH$_2$Cl$_2$ in sequence. It was then dried in vacuum to obtain a dark green solid (0.7 g, yield: 77%). It was further purified by sublimation (300° C., 10⁻⁵ mmHg) to obtain a dark green solid (0.59 g, yield: 85%). ¹⁹F NMR analysis confirms that obtained solid contains a mixture of trans- and cis-isomers in approx. 87.2% (IB-2) and 12.8% (IIB-2).

Spectral data of compound (IB-2): ¹H NMR (500 MHz, d₇-DMF, 350 K): δ 11.22 (d, J=6 Hz, J$_{PtH}$=46 Hz, 2H), 9.45 (s, 2H), 8.47 (s, 2H), 7.79 (d, J=6 Hz, 2H), 1.50 (s, 18H). ¹⁹F NMR (470 MHz, d₇-DMF, 350 K): δ−70.23 (s, 3F, CF₃).

Spectral data of compound (IIB-2): ¹H NMR (500 MHz, d₆-DMSO, 350 K): δ 9.16 (s, 2H), 8.97 (d, J=6 Hz, 2H), 8.36 (s, 2H), 7.71 (d, J=6 Hz, 2H), 1.45 (s, 18H). ¹⁹F NMR (470 MHz, d₆-DMSO, 350 K): δ−68.81 (s, 3F, CF₃).

Example 20: Preparation of Compounds (IB-3) and (IIB-3)

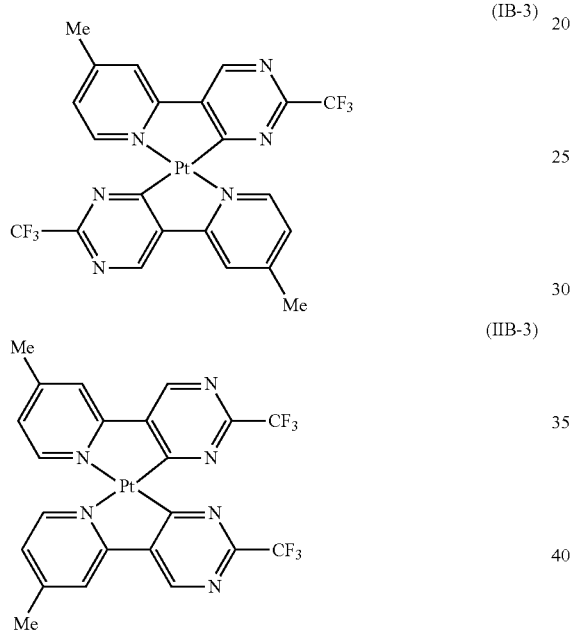

K₂PtCl₄ (0.2 g, 0.48 mmol, 1 eq.), ligand precursor L14 (0.23 g, 0.97 mmol, 2 eq.) and KOAc (1.89 g, 19.3 mmol, 40 eq.) were placed in a two-neck round-bottom flask fitted with refluxing condenser. Pivalic acid (10 mL) was added thereto and reaction mixture was refluxed for 24 hours under N₂. Dark green precipitate was formed during reflux. Then the reaction mixture was cooled to room temperature and deionized water (20 mL) was added. The solid was collected by filtration and thoroughly washed with water, ethyl acetate and CH₂Cl₂ in sequence. It was then dried in vacuum to obtain a dark green solid (0.25 g, yield: 74%). It was further purified by sublimation (300° C., 10⁻⁵ mmHg) to obtain a dark green solid (0.19 g, yield: 78%). ¹⁹F NMR analysis confirms that obtained solid contains a mixture of trans- and cis-isomers in approx. 80.9% (IB-3) and 19.1% (IIB-3).

Spectral data of compound (IB-3): ¹H NMR (500 MHz, d₇-DMF, 350 K): δ 11.12 (d, J=6 Hz, J$_{PtH}$=46 Hz, 2H), 9.24 (s, 2H), 8.32 (s, 2H), 7.56 (d, J=6 Hz, 2H), 2.61 (s, 6H). ¹⁹F NMR (470 MHz, d₇-DMF, 350 K): δ −70.31 (s, 3F, CF₃).

Spectral data of compound (IIB-3): ¹H NMR (500 MHz, d₆-DMSO, 350 K): δ 8.97 (s, 2H), 8.84 (d, J=5.5 Hz, 2H) 8.25 (s, 2H), 7.53 (d, J=5.5 Hz, 2H), 2.56 (s, 6H). ¹⁹F NMR (470 MHz, d₆-DMSO, 350 K): δ −68.88 (s, 3F, CF₃).

Example 21: Preparation of Compounds (IB-4) and (IIB-4)

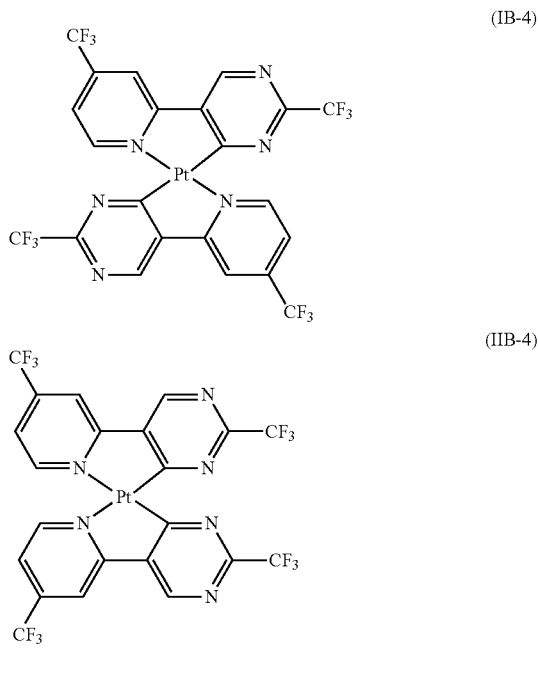

Mixture of compounds (IB-4) and (IIB-4) was prepared using L15 and K₂PtCl₄ using procedures similar to those described for compounds (IB-3) and (IIB-3). The obtained solid was then dried in vacuum to obtain a yellow solid (0.24 g, yield: 62%). It was further purified by sublimation (300° C., 10⁻⁵ mmHg) to obtain a yellow solid (0.171 g, yield: 73%). ¹⁹F NMR analysis confirms the formation of trans- and cis-isomers in approx. 70.6% (IB-4) and 29.4% (IIB-4).

Spectral data of compound (IB-4): ¹H NMR (500 MHz, d₇-DMF, 350 K): δ 11.54 (d, J=6 Hz, J$_{PtH}$=46 Hz, 2H), 9.56 (s, 2H), 8.89 (s, 2H), 8.13 (d, J=6 Hz, 2H). ¹⁹F NMR (470 MHz, d₇-DMF, 350 K): δ−65.09 (s, 3F, CF₃), −70.37 (s, 3F, CF₃).

Spectral data of compound (IIB-4): ¹H NMR (500 MHz, d₆-DMSO, 350 K): δ 9.34 (d, J=5.5 Hz, 2H), 9.30 (s, 2H), 8.85 (s, 2H), 8.05 (d, J=5.5 Hz, 2H). ¹⁹F NMR (470 MHz, d₆-DMSO, 350 K): δ−63.59 (s, 3F, CF₃), −69.02 (s, 3F, CF₃).

Figure 2:
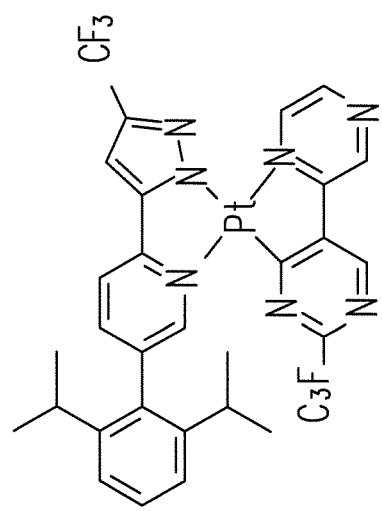
FIG. 2 shows the X-ray crystal diffraction analysis of compound (IA-10) synthesized in example 10 of the invention.
Figure 2:
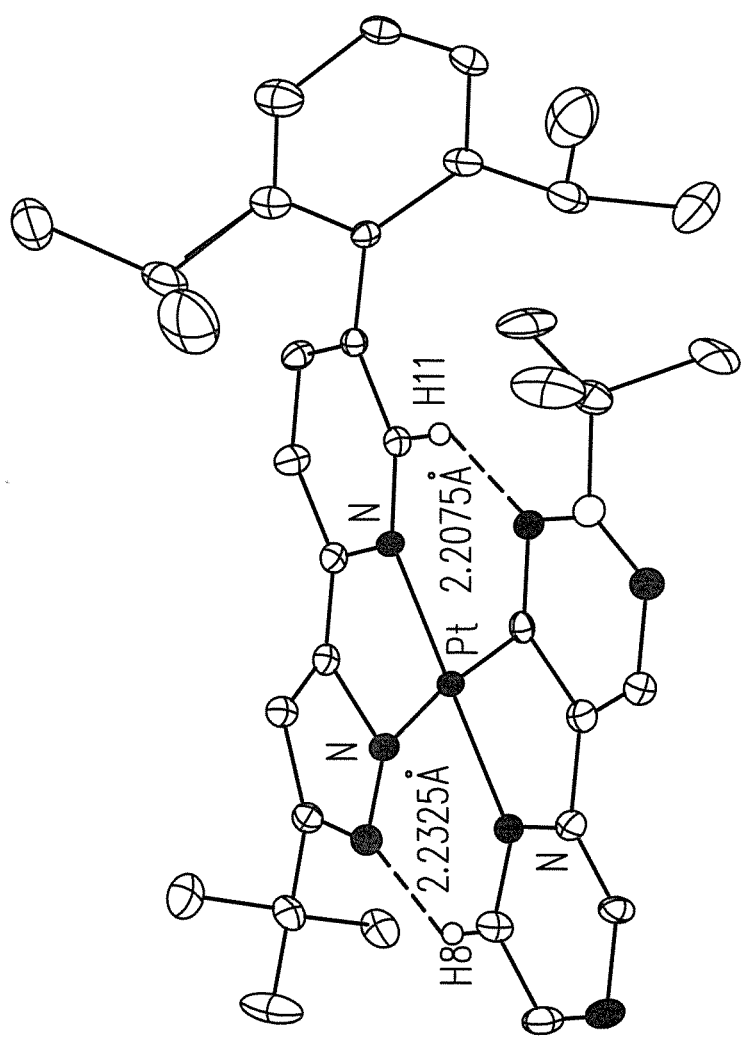

FIG. 1 shows the X-ray crystal diffraction analysis of compound (IA-5) synthesized in example 5 of the invention. FIG. 2 shows the X-ray crystal diffraction analysis of compound (IA-10) synthesized in example 10 of the invention. Whether a hydrogen bond exists between the chelating ligands can be proved from the X-ray crystal diffraction analysis. Specifically, if the nitrogen atom and the hydrogen atom form an inter-ligand hydrogen bond, the non-bonding distance between the nitrogen atom and the hydrogen atom is reduced to the range of 2.2 Å to 2.5 Å, and the latter 2.5 Å is the total length of van der Waals radius of nitrogen and hydrogen atoms. As shown in FIG. 1, the distance between the nitrogen atom and the hydrogen atom on the left side of compound (IA-5) is 2.2497 Å, the distance between the nitrogen atom and the hydrogen atom on the right side of compound (IA-5) is 2.1743 Å, and both distances are less than 2.5 Å. Besides, as shown in FIG. 2, the distance between the nitrogen atom and the hydrogen atom on the left side of compound (IA-10) is 2.2325 Å, the distance between the nitrogen atom and the hydrogen atom on the right side of compound (IA-10) is 2.2075 Å, and both distances are less than 2.5 Å. Therefore, two hydrogen bonds are confirmed to present between two ligands of the platinum complex of the invention, so as to further stabilize the structure of the platinum complex of the invention. Such stable structure of the platinum complex of the invention provides a better intermolecular stack and therefore a longer emission wavelength.

Figure 3:
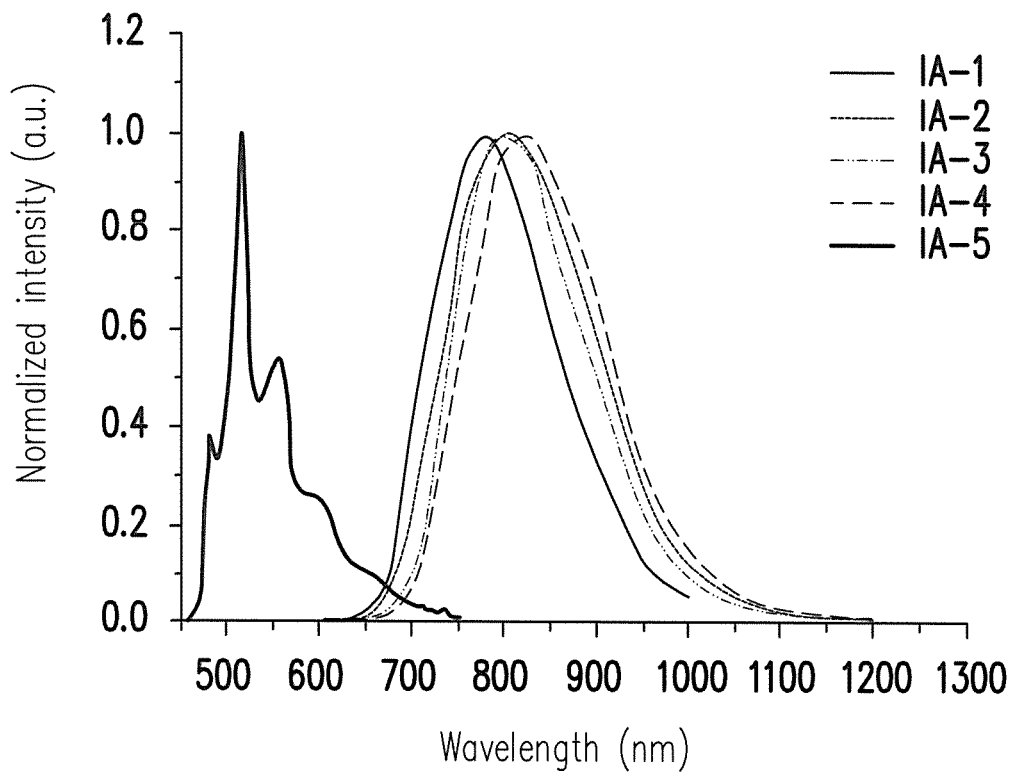
FIG. 3 shows the emission spectrum of each of compounds (IA-1) to (IA-5) synthesized in examples 1 to 5 of the invention.
Figure 4:
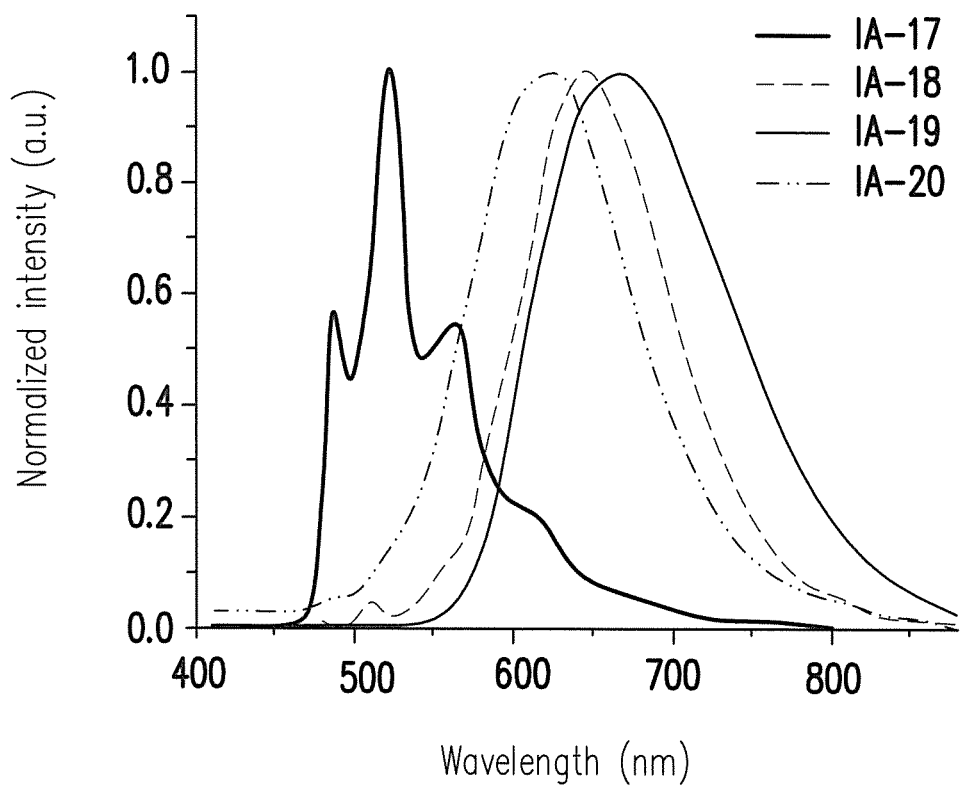
FIG. 4 shows the emission spectrum of each of compounds (IA-17) to (IA-20) synthesized in examples 12 to 15 of the invention.
Figure 5:
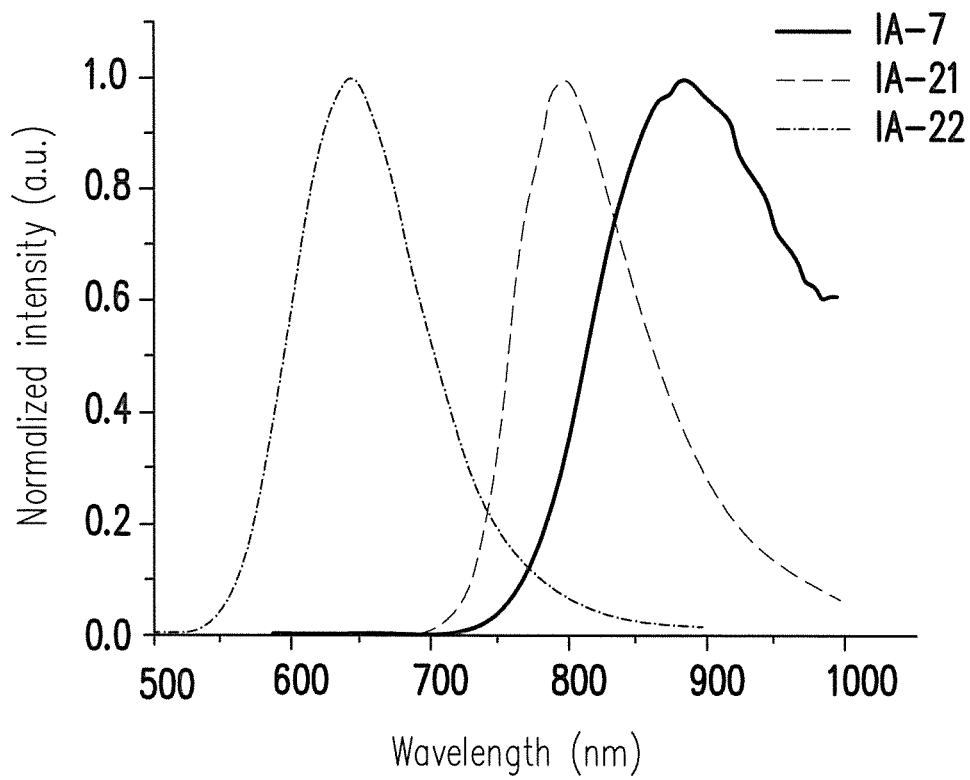
FIG. 5 shows the emission spectrum of each of compounds (IA-7), (IA-21) and (IA-22) synthesized in examples 7, 16 and 17 of the invention.
Figure 6:
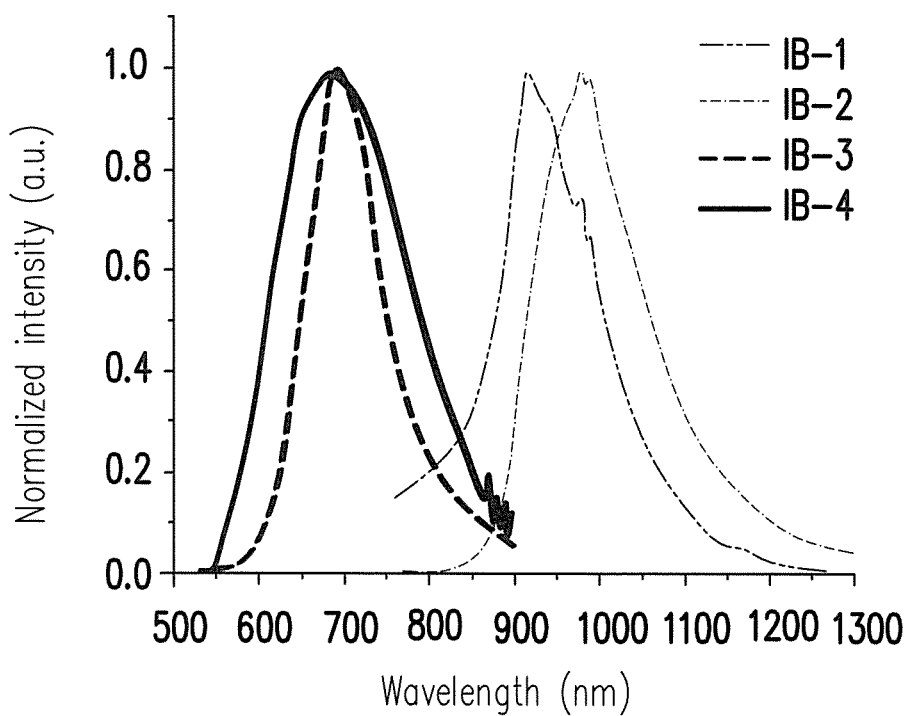
FIG. 6 shows the emission spectrum of each of compounds (IB-1) to (IB-4) synthesized in examples 18 to 21 of the invention.

FIG. 3 shows the emission spectrum of each of compounds (IA-1) to (IA-5) synthesized in examples 1 to 5 of the invention. FIG. 4 shows the emission spectrum of each of compounds (IA-17) to (IA-20) synthesized in examples 12 to 15 of the invention. FIG. 5 shows the emission spectrum of each of compounds (IA-7), (IA-21) and (IA-22) synthesized in examples 7, 16 and 17 of the invention. FIG. 6 shows the emission spectrum of each of compounds (IB-1) to (IB-4) synthesized in examples 18 to 21 of the invention. The emission peak position (em $\lambda_{max}$), luminescent lifetime ($\tau_{obs}$), and quantum yield (P) of each synthesized compound are listed in Table 1 below.

TABLE 1

| compound | em. $\lambda_{max}$ (nm) [a] (sh = shoulder) | Φ (%) [a] | $\tau_{obs}$ (ns) [a] |
|---|---|---|---|
| IA-1 | 778 | 33 | 129 |
| IA-2 | 811 | 32 | 169 |
| IA-3 | 801 | 13 | 219 |
| IA-4 | 824 | 15 | 365 |
| IA-5 | 480, 515, 557, 599 (sh) | 9.2 | 1176 |
| IA-7 | 882 | 20 | 50 |
| IA-10 | 499, 535, 577 (sh), 619 (sh) | 4.5 | 1217 |
| IA-17 | 488, 523, 563 | 44 | 6167 |
| IA-18 | 646 | 52 | 3958 |
| IA-19 | 661 | 57 | 1061 |
| IA-20 | 626 | 60 | 1701 |
| IA-21 | 797 | 27 | 318 |
| IA-22 | 641 | 77 | 1745 |
| IB-1 | 916 | 56 | 510 (62%), 113 (38%) |
| IB-2 | 984 | 45 | 118 (89%), 27 (11%) |
| IB-3 | 694 | 17 | 1262 (49%), 428 (36%), 60 (15%) |
| IB-4 | 692 | 88 | 1079 (70%), 190 (30%) |

[a] Photoluminescent spectrum, quantum yield and luminescence lifetime characteristics were measured using sublimed powder.

It can be known from FIGS. 3 to 6 and Table 1 that, the platinum complex of the invention has a peak emission wavelength ($\lambda_{max}$) of about 480 nm and 984 nm, so the application thereof is relatively broad. For instance, when the emission wavelength of each of compounds (IA-1) to (IA-4) and (IB-1) to (IB-4) is about 700 nm or greater than 700 nm and falls within the range of near-infrared light, and such platinum complex can be applied in the military or medical field. When the emission wavelength of compound (IA-5) of the invention is in the visible light range, such platinum complex can be applied in the OLED field.

Figure 7:
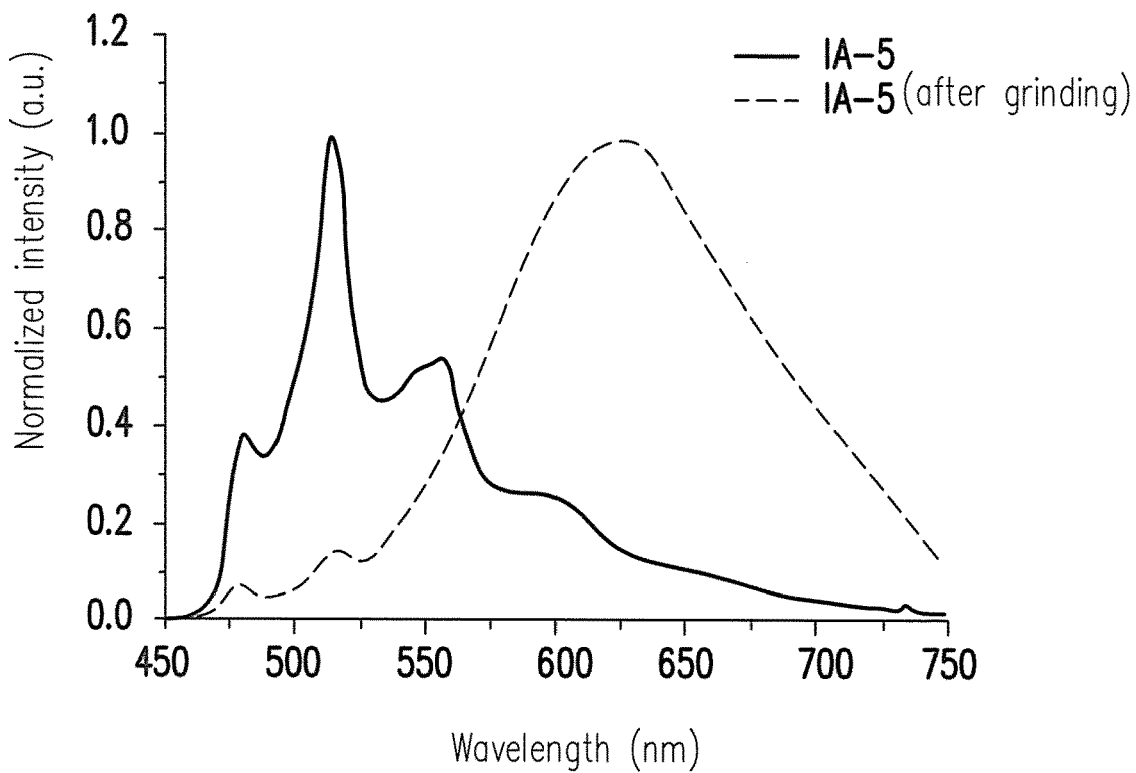
FIG. 7 shows the emission spectra of compound (IA-5) of the invention before and after grinding.
Figure 8:
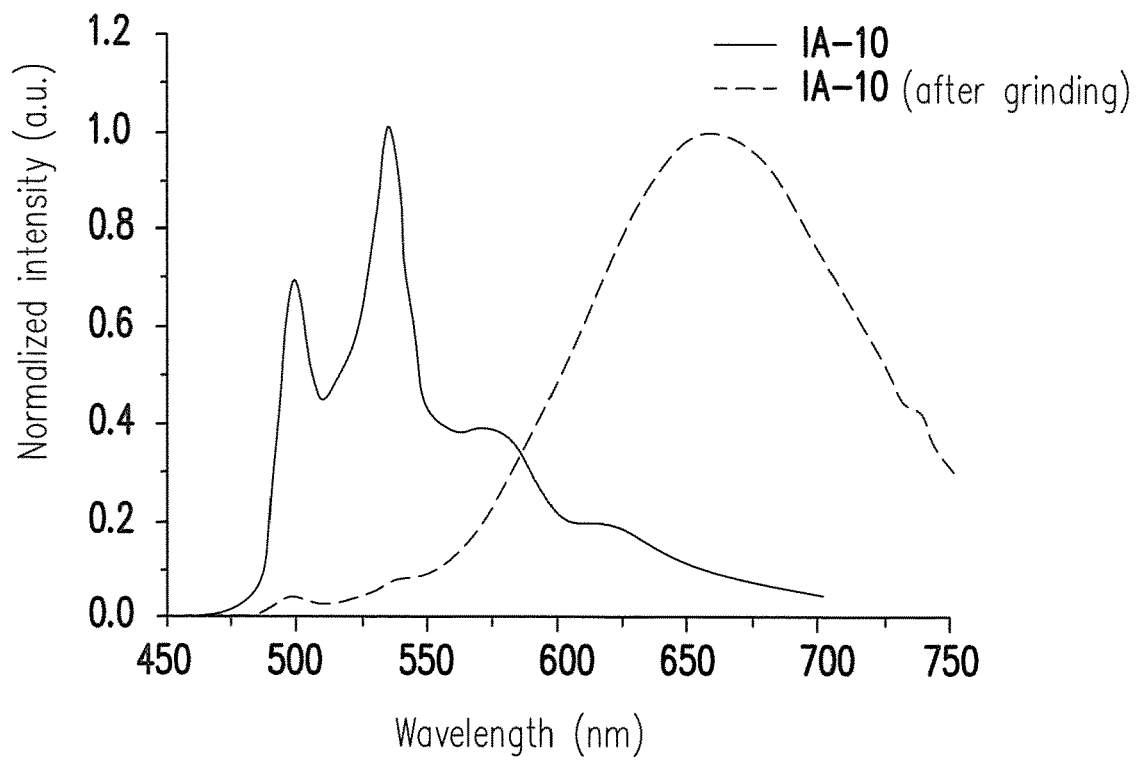
FIG. 8 shows the emission spectra of compound (IA-10) of the invention before and after grinding.

FIG. 7 shows the emission spectra of compound (IA-5) of the invention before and after grinding. FIG. 8 shows the emission spectra of compound (IA-10) of the invention before and after grinding. The emission peak position (em $\lambda_{max}$), full width at half maximum (FWHM), luminescent lifetime ($\tau_{obs}$), and quantum yield (Φ) of each synthesized compound are listed in Table 2 below.

TABLE 2

| compound | em. $\lambda_{max}$ (nm) (sh = shoulder) | Φ (%) | $\tau_{obs}$ (ns) |
|---|---|---|---|
| IA-5 | 480, 515, 557, 599 (sh) | 9.2 | 1176 |
| IA-5 (after grinding) | 622 | 38.4 | 1406 |
| IA-10 | 499, 535, 577 (sh), 619 (sh) | 4.5 | 1217 |
| IA-10 (after grinding) | 659 | 29.6 | 1199 |

The change of color which occurs when the compound is put under stress in the solid state by mechanical grinding, crushing, milling, friction and/or rubbing; or in the solid or solution state by high pressure or sonification is covered by the term "mechanochromism".

As shown in FIG. 7, FIG. 8 and Table 2, it is found that the platinum complex of the invention has the mechanochromism property since the emission wavelength thereof is changed after mechanical grinding.

In summary, when a C—H . . . N hydrogen bond exists between two chelating ligands of the platinum complex of the invention, the bonding strength between the chelating ligands and the central platinum metal can be increased, so as to further stabilize the structure of the platinum complex of the invention. Besides, such hydrogen bond is beneficial to reduce steric hindrance between the chelating ligands, so as to provide a standard planar molecular structure. When the complex of the invention is condensed to form a solid structure, such hydrogen bond enables the formation of a defect-free linear stack. Specifically, the intermolecular Pt . . . Pt spacing is shortened to form a MMLCT excited state electron configuration, so the emission of the complex significantly red shifts to the near infrared region. Since the total negative charge of two chelating ligands of the platinum complex of the invention is the same as the positive charge of the central platinum metal ion, a neutral platinum complex can be formed. A neutral complex generally has better volatility, and therefore a multilayer OLED device can be formed using an evaporation method, and the luminous efficiency thereof can be improved. Moreover, the platinum complex of the invention has at least one C—Pt coordination bond. The C—Pt bond has a greater bond energy than that of the N—Pt bond, so the overall bonding strength between the chelating ligands and the central metal atom can be increased. Accordingly, the energy level of metal-centered dd excited states can be increased, such that influence on the lowest energy excited state from the dd excited states can be reduced, and non-radiative quenching can be reduced. As a result, the luminous efficiency of the complex can be increased. In addition, the platinum complex of the invention is easy to synthesize, so it is suitable for mass production and accordingly provides a higher commercial value.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A platinum complex, having a structure represented by formula (I):

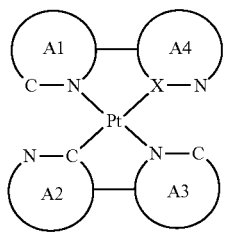
(I)

wherein
A1 to A4 each independently represent a 5-membered or 6-membered unsaturated ring;
X is carbon or nitrogen; and
a first chelating ligand comprising A1 and A4 has a minus one formal charge, and a second chelating ligand comprising A2 and A3 has a minus one formal charge.

2. The platinum complex of claim 1, having a structure represented by formula (I-1):

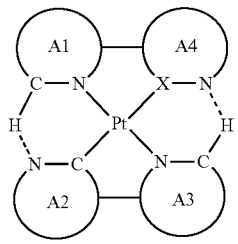
(I-1)

wherein a hydrogen bond exists between the first chelating ligand and the second chelating ligand.

3. The platinum complex of claim 1, having a structure represented by formula (IA):

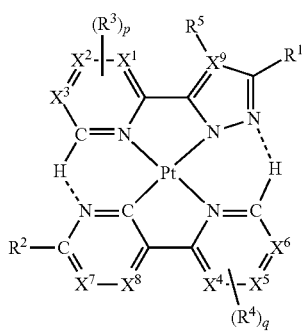
(IA)

wherein
$X^1$ to $X^9$ each independently represent carbon or nitrogen;
$R^1$ and $R^2$ each independently represent substituted or unsubstituted $C_1$-$C_6$ alkyl, —$CF_2H$, —$CFH_2$, substituted or unsubstituted $C_6$-$C_{12}$ aryl or $C_mF_{2m+1}$, m is an integer of 0 to 5;
$R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or —$C_nF_{2n+1}$, and n is an integer of 0 to 3;
p and q each independently represent an integer of 0 to 3;
when $X^9$ is carbon, $R^5$ can be hydrogen, fluoride, chloride or cyano;
when p is equal to or greater than 2, two or more $R^3$'s may join to form a $C_3$-$C_8$ aromatic ring; and
when q is equal to or greater than 2, two or more $R^4$'s may join to form a $C_3$-$C_8$ aromatic ring.

4. The platinum complex of claim 3, wherein $R^1$ comprises —$C_6F_{2n+1}$, and n is an integer of 0 to 3.

5. The platinum complex of claim 3, having a structure represented by one of formula (IA-1) to formula (IA-22):

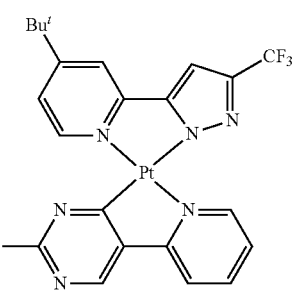
IA-1

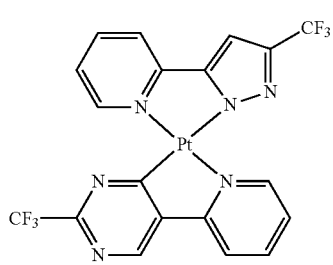
IA-2

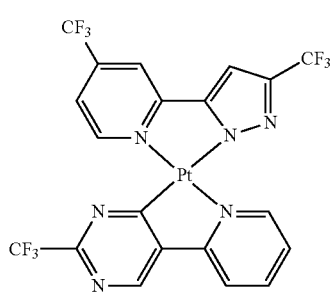
IA-3

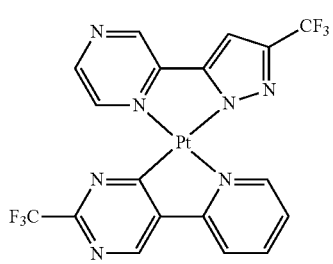
IA-4

IA-5
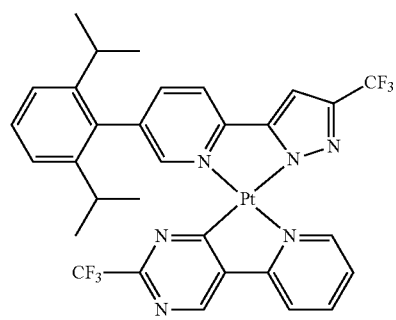
IA-6
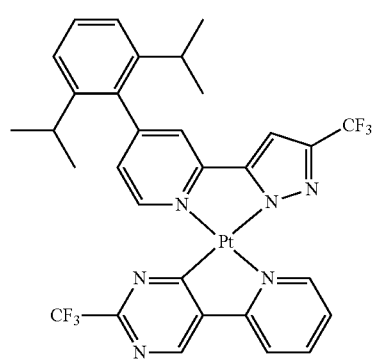
IA-7
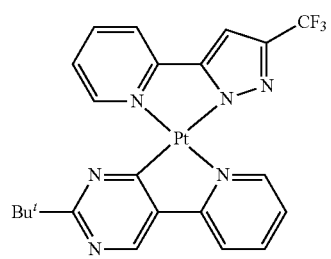
IA-8
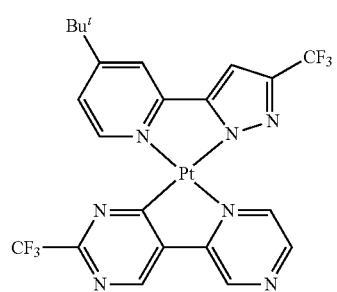
IA-9
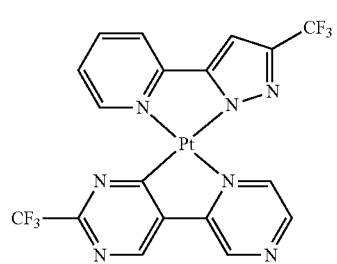
IA-10
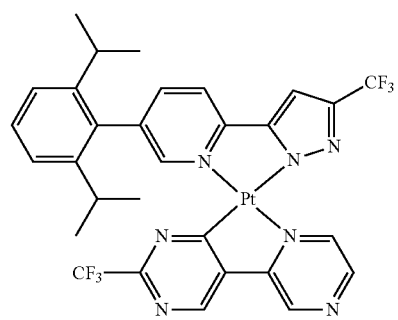
IA-11
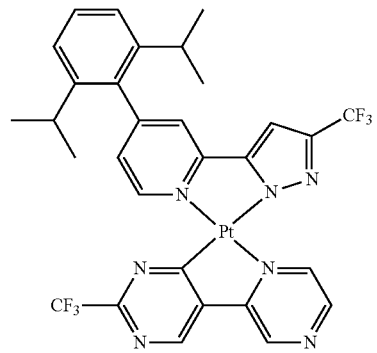
IA-12
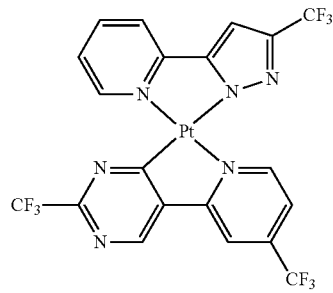
IA-13
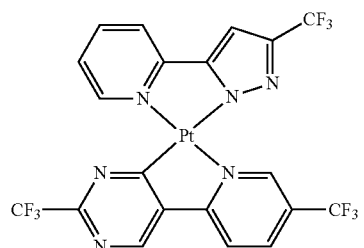
IA-14
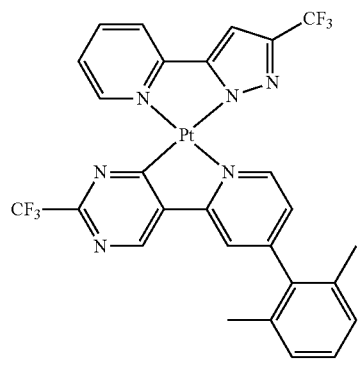

-continued
IA-15
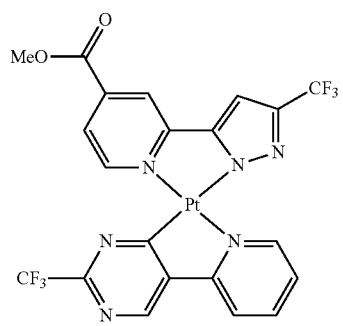
IA-16
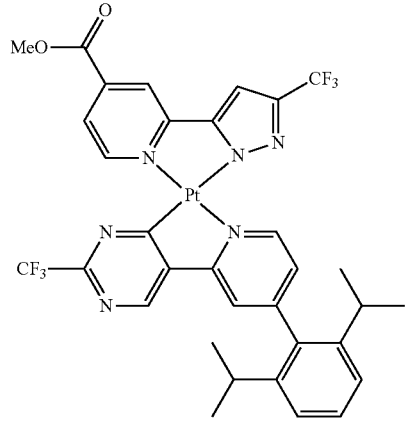
IA-17
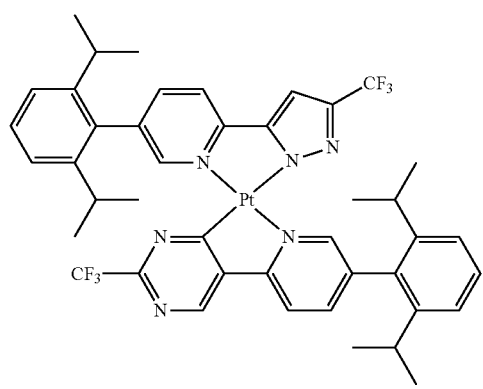
IA-18
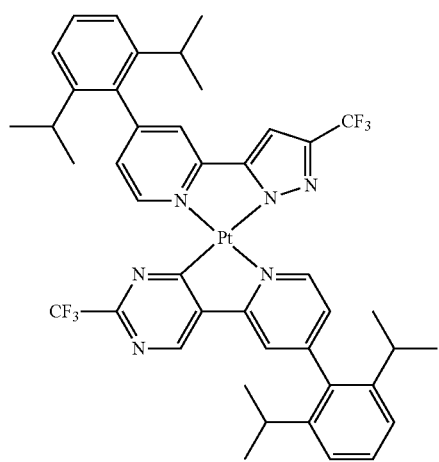
-continued
IA-19
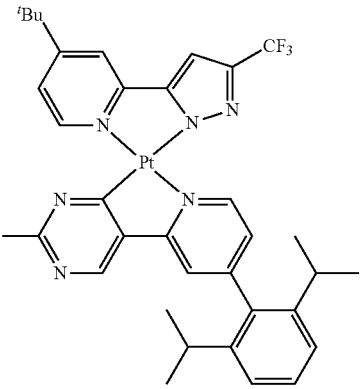
IA-20
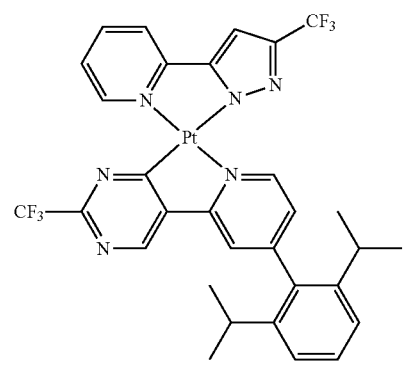
IA-21
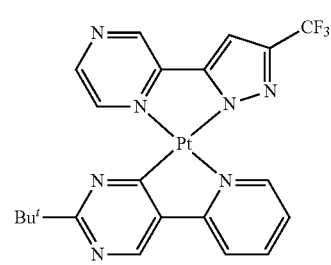
IA-22
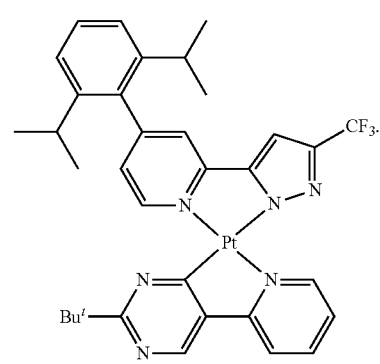
6. The platinum complex of claim 1, having a structure represented by formula (IB):

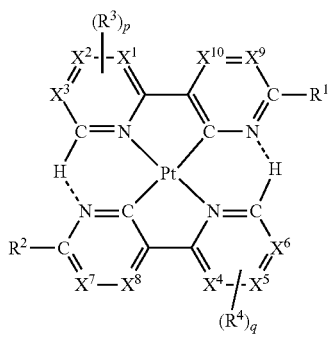

(IB)

wherein $X^1$ to $X^{10}$ each independently represent carbon or nitrogen;

$R^1$ and $R^2$ each independently represent substituted or unsubstituted $C_1$-$C_6$ alkyl, —$CF_2H$, —$CFH_2$, substituted or unsubstituted $C_6$-$C_{12}$ aryl or —$C_mF_{2m+1}$, and m is an integer of 0 to 5;

$R^3$ and $R^4$ each independently represent hydrogen, substituted or unsubstituted $C_1$-$C_{12}$ alkyl, substituted or unsubstituted $C_1$-$C_6$ alkoxy, substituted or unsubstituted $C_1$-$C_6$ carboxylate, substituted or unsubstituted $C_6$-$C_{12}$ aryl or —$C_nF_{2n+1}$, n is an integer of 0 to 3;

p and q each independently represent an integer of 0 to 3;

when p is equal to or greater than 2, two or more $R^3$'s may join to form a $C_3$-$C_8$ aromatic ring; and when q is equal to or greater than 2, two or more $R^4$'s may join to form a $C_3$-$C_8$ aromatic ring.

7. The platinum complex of claim 6, having a structure represented by one of formula (IB-1) to formula (IB-4):

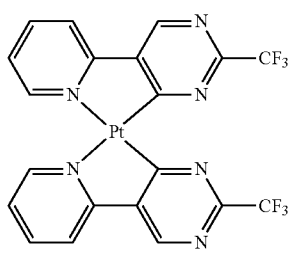

IIB-1

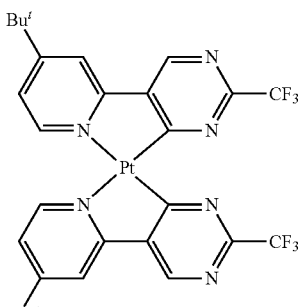

IIB-2

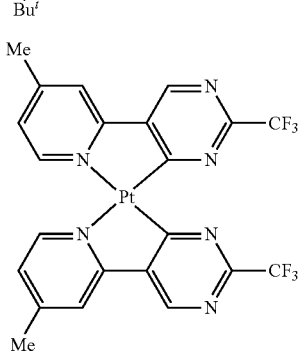

IIB-3

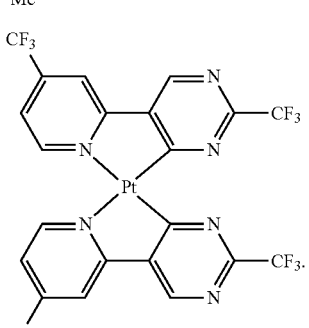

IIB-4

8. The platinum complex of claim 1, having an emission wavelength of 450 nm to 1,200 nm.

9. An apparatus emitting visible light or near-infrared light, comprising the platinum complex of claim 1.

10. An organic light-emitting diode, comprising two electrodes and a light-emitting layer disposed between the two electrodes, wherein the light-emitting layer contains the platinum complex of claim 1.

\* \* \* \* \*